United States Patent
Greeley et al.

(10) Patent No.: US 6,493,400 B1
(45) Date of Patent: Dec. 10, 2002

(54) HARMONIC CANCELLATION SYSTEM

(75) Inventors: John S. Greeley, Ambler, PA (US); James J. Edelen, III, Jamison, PA (US)

(73) Assignee: Bae Systems Aerospace Electronics Inc., Lansdale, PA (US)

( * ) Notice: Subject to any disclaimer, the term of this patent is extended or adjusted under 35 U.S.C. 154(b) by 0 days.

(21) Appl. No.: 09/294,098

(22) Filed: Apr. 19, 1999

(51) Int. Cl.[7] ............................................. H04L 25/03
(52) U.S. Cl. ...................................... 375/297; 455/126
(58) Field of Search ............................... 375/297, 296; 330/149; 455/126

(56) References Cited

U.S. PATENT DOCUMENTS

| | | | |
|---|---|---|---|
| 4,412,337 A | 10/1983 | Bickley et al. | 375/60 |
| 4,453,133 A | 6/1984 | Travis | 330/149 |
| 4,879,519 A | 11/1989 | Myer | 330/149 |
| 4,967,164 A | 10/1990 | Sari | 330/149 |
| 5,049,832 A | 9/1991 | Cavers | 330/149 |
| 5,105,445 A | 4/1992 | Karam et al. | 375/60 |
| 5,107,520 A | 4/1992 | Karam et al. | 375/60 |
| 5,126,687 A | 6/1992 | Onoda et al. | 330/149 |
| 5,193,224 A | 3/1993 | McNicol et al. | 455/126 |
| 5,262,734 A | 11/1993 | Dent et al. | 330/52 |
| 5,404,378 A | 4/1995 | Kimura | 375/296 |

*Primary Examiner*—Stephen Chin
*Assistant Examiner*—David B. Lugo
(74) *Attorney, Agent, or Firm*—Drinker Biddle & Reath LLP

(57) ABSTRACT

An RF transmission system including an RF power amplifier, said system comprising an harmonic cancellation processor. The harmonic cancellation processor produces a predistorted RF input signal to the RF amplifier which cancels harmonic energy generated by the amplifier. The RF output of the amplifier is sampled and stored in the harmonic cancellation processor. The harmonic cancellation processor also comprises a digital signal processor controlled by a computer program, the program comprising steps for analyzing the harmonic content of the sampled RF feedback signal, steps for comparing the harmonic content of the RF feedback signal to a history value for harmonic content, steps for adaptively correcting a predistorted RF waveform based on the harmonic content of the RF feedback signal to cancel harmonics produced by the RF amplifier when the predistorted waveform is input to the amplifier, and steps for producing a digital sample representation of the predistorted RF waveform for conversion to analog form and input to the RF amplifier.

28 Claims, 10 Drawing Sheets

HARMONIC CANCELLATION SYSTEM

A portion of the disclosure of this patent document contains material which is subject to copyright protection. The copyright owner has no objection to the facsimile reproduction by anyone of the patent document or the patent disclosure, as it appears in the Patent, and Trademark Office patent file or records, but otherwise reserves all copyright rights whatsoever.

FIELD OF THE INVENTION

The present invention relates to radio frequency systems, and particularly to the cancellation of harmonics generated in high power radio frequency amplifiers used for communications, electronic warfare, and other RF systems.

BACKGROUND OF THE INVENTION

Managing harmonic frequency distortion in radio frequency (RF) amplifiers and transmission systems is always a prime consideration for system designers. Given that the most efficient RF power amplifiers are commonly class AB or class C amplifiers that operate on less than the complete small signal waveform, generating large harmonic distortion components, designers have to include hardware in RF systems that removes or suppresses the harmonic frequency content of the system output.

In fixed frequency systems the problem is easily managed by including filters at the amplifier output. Tuned frequency systems, and frequency-agile systems particularly, must be capable of filtering harmonics across broad ranges of frequency that change constantly. This most often requires a bank of filters having different cutoff frequencies that must be switched into and out of the system as the transmission frequency changes. Where the frequency changes quickly and often, switching these filters becomes more difficult and places restrictions on system performance related to the finite switching times and impulse responses of the filters.

The most efficient way to reduce the harmonic distortion of a generated RF signal is to suppress the generation of the harmonic distortion in the amplifier without trading away the efficiency of the broadband amplifier. The present invention is directed to controlling the harmonic content of the output of high power RF amplifiers for modulated RF systems.

One method of controlling harmonics in the output of a device is to predistort the input signal to the device. The predistortion creates frequency products at the input that, when passing through the non-linear amplifier device, combine with and cancel the normal harmonic output of the device. This is normally done at baseband or intermediate frequencies, predistorting the modulation signal (or an IF) before combining it with the final RF carrier wave. In this way, the harmonic distortion of the information signal may be controlled within the modulated signal output.

However, nothing in this process addresses the problem of the harmonic frequency components generated by an RF amplifier operating on the modulated RF carrier wave. These harmonics must be controlled at the output of the transmission system. The present invention is intended to control RF harmonic output to avoid the necessity for high power switched RF filters and the practical limitations that they impose on a tuned frequency transmission system.

SUMMARY OF THE INVENTION

The present invention is a harmonic cancellation system for broadband, high-power RF transmission systems. A transmission system constructed according to the invention is capable of amplifying a modulated RF waveform, performing direct digital sampling of the RF waveform, analyzing the harmonic content of the waveform, and generating a predistortion signal to feed back into the amplifier input to suppress the harmonics generated in the RF amplifier.

The invention comprises a high-power RF amplifier, a directional coupler for diverting a small portion of the amplifier output to a feedback controlled, harmonic cancellation processor, a high-speed digital sampling device, a digital signal processing device for analysis of the RF signal harmonic content, a digital waveform generator for generating a predistorted RF carrier signal, and a modulation input and control.

The harmonic cancellation system comprises a computer-based apparatus for cancelling output signal harmonics in a radio frequency transmission system, comprising a radio frequency amplifier, a means for diverting a portion of the amplifier output as a feedback signal. The system further comprises a computer-controlled harmonic cancellation processor, said processor comprising an analog to digital converter for sampling the feedback signal from the diverting means, a digital signal processor for calculating the harmonic content of the amplifier output feedback signal, said digital signal processor comprising machine-readable program instructions for analyzing the feedback signal harmonic content and generating a predistorted RF waveform for cancelling the harmonics generated by the radio frequency amplifier, and a digital to analog converter to produce a predistorted RF waveform for input to the radio frequency amplifier.

The invention further comprises a digital signal processor having machine readable instructions for analyzing the harmonic content of the RF output signal and generating a predistorted RF signal for combining with the modulated RF carrier wave input into the RF amplifier. The instructions comprise a method for cancelling the harmonics comprising the steps: creating a matrix of real-time digital samples of a representative portion of an RF waveform produced by an amplifier, performing a fast Fourier transform on the samples of RF waveform to quantify the harmonic content of the waveform, comparing each measured harmonic magnitude and phase to an immediately previous magnitude and phase that is stored in memory for the same harmonic, comparing each harmonic magnitude and phase in the current predistorted waveform for input to the amplifier to an immediately previous magnitude and phase that is stored in memory for the same harmonic, calculating a new model transfer function for the amplifier using the results of the comparisons of the previous two steps, computing a new RF input waveform for the amplifier that is predistorted using the new model transfer function for the amplifier, generating a new RF input waveform with predistortion for input to the RF amplifier to cancel harmonics produced by the amplifier.

DESCRIPTION OF THE DRAWINGS

For the purpose of illustrating the invention, there is shown in the drawings a form which is presently preferred; it being understood, however, that this invention is not limited to the precise arrangements and instrumentalities shown.

DETAILED DESCRIPTION OF THE INVENTION

The present invention is a high power RF transmission system having an adaptive harmonic cancellation processor. The cancellation is performed through an adaptive, complex, and real-time predistortion of the input signal based on a harmonic analysis of the output RF waveform. The output of a high power RF amplifier is sampled by diverting a small portion of the RF signal to a feedback loop and converting the RF wave to digital form in a high speed digital to analog converter. The sampled RF signal is analyzed for its harmonic content by a digital signal processor operated by machine readable computer program instructions. These instructions comprise a method for computing the harmonic content of the RF signal, adapting to changes in the transfer function of the RF amplifier over time, and determining the RF harmonic predistortion that must be synthesized into RF input for the amplifier to cancel the harmonic distortion created by the amplifier.

Figure 1:
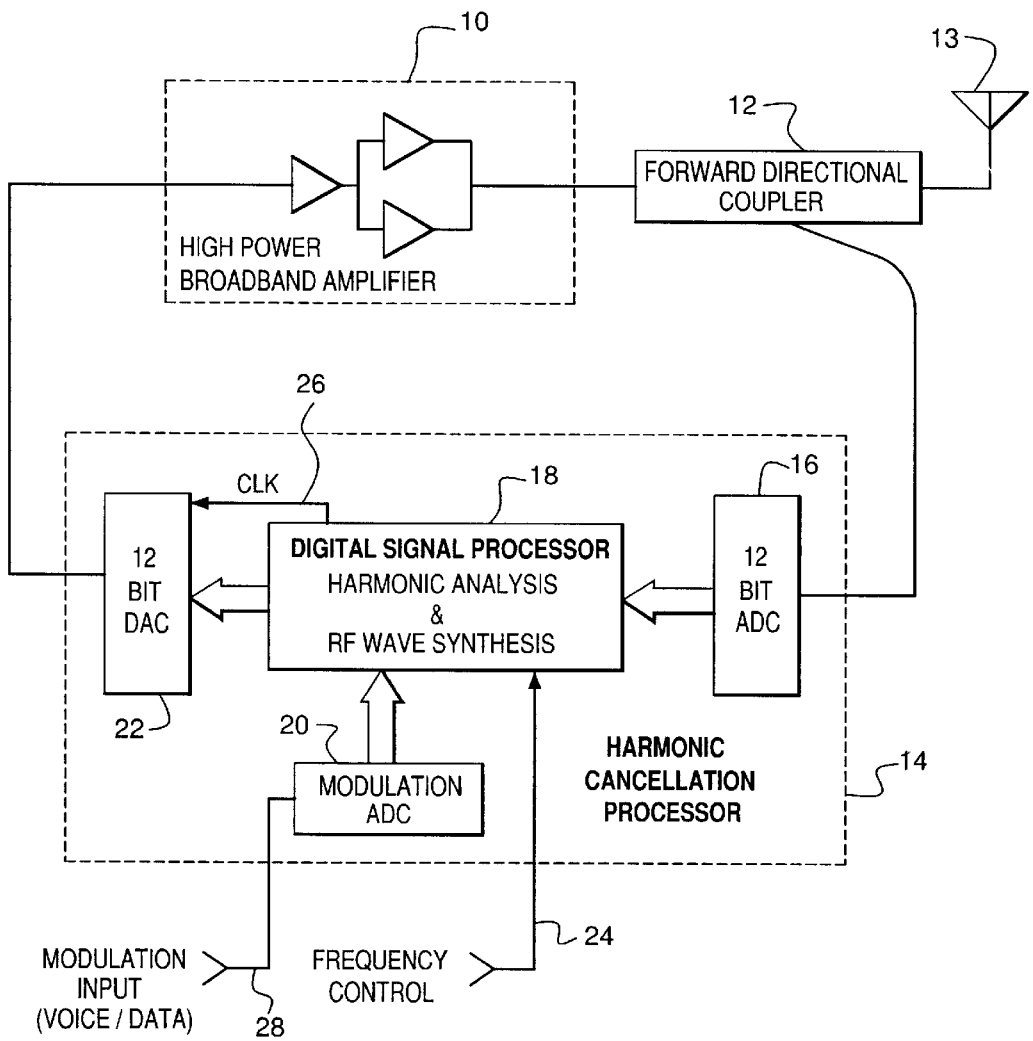
FIG. 1 is a block diagram of a high power RF transmission system according to the invention.

Referring to the Figures, in which like reference numerals indicate like elements, FIG. 1 illustrates a broadband RF transmitter incorporating the present invention. The transmitter comprises a broadband RF power amplifier 10 that is common to transmission systems operating in the HF frequencies and higher. The power amplifier 10 feeds its high power RF output into a forward directional coupler 12. The coupler 12 diverts a small portion of the RF signal to serve as a feedback input into a harmonic cancellation processor 14. The remainder of the amplified RF signal is passed on to an antenna 13 for transmission. There may be a low pass filter preceding the antenna in some systems, according to the requirements of the system.

The harmonic cancellation processor 14 comprises a high speed, high resolution analog to digital (A/D) converter 16 for converting RF signals to digital form. A digital signal processor (DSP) 18 performs an analysis of the sampled RF signal to determine its harmonic content and, through a computer program specially written to implement this function, transforms the harmonic content information into a predistortion waveform for the RF carrier signal in the transmission system. The computer program begins with a simplified model of the broadband amplifier's transfer function, but quickly adapts the model based on the measured values being taken in the harmonic cancellation processor's signal analysis stage.

Modulation information, which may be voice or data, is an input to the harmonic cancellation processor 14 through a modulation input 28. The modulation information is sampled in an analog to digital converter 20. The predistorted digital RF carrier waveform produced in the DSP under computer program control is combined with the digital modulation information by the signal processor 18. The combined predistorted digital RF waveform with modulation is passed through a high speed 12-bit digital to analog (D/A) converter 22 to produce the analog RF signal that is input to the broadband power amplifier 10. A frequency control input 24 provides the data that informs the digital signal processor 18 what the RF carrier frequency is supposed to be at any given time.

The RF frequency signal, predistorted for harmonic suppression and modulated with an information signal, is produced by the D/A converter 22. The converter 22 is directly controlled by the D/A clock (CLK) 26 originating from the digital signal processor 18 (or controlled by it if it is a separate integrated circuit). Because the clock rate is critical to setting the frequency of the analog RF waveform, the D/A clock may be used to frequency modulate the RF signal directly. A change in the clock rate directly changes the output frequency of the signal produced by the D/A converter 22. Modulating the clock rate frequency-modulates the RF signal sent to the RF amplifier.

The harmonic cancellation processor 14 may comprise one or more computer elements to control the various functions that are performed in the processor. Electronic memory devices may also be part of the harmonic cancellation processor 14 in the event that the digital signal processor 18 does not have sufficient memory to store the programmed machine instructions to perform the cancellation process. The harmonic cancellation process may be controlled entirely by the digital signal processor 18, or the control functions may be performed by a master computer while the analytical functions may be performed by dedicated computer equipment. In the presently described embodiment of the invention, the digital signal processor 18 is implemented using a commercially available TMS320C80 DSP computer card. Operating under the control of a computer program for performing the harmonic analysis, adaptive recalculation of the amplifier transfer function, and the transformation of the harmonic content at the amplifier output into a predistorted RF carrier for input into the amplifier, the digital signal processor 18 and its program are the key elements of the harmonic cancellation processor 14.

The harmonic cancellation processor 14 is presently capable of operation on modulated RF frequencies up to about 30 MHz. The upper limit on RF frequency is imposed by two factors. First, the speed of the A/D and D/A converters 16, 22 is a limitation. Digital converter technology is advancing at a steady rate, pushed by demands for higher speed and more resolution (more bits of data per sample) for countless uses. At the time of the present invention, the converters available operated at 60 Msps (mega samples per second). Thus, the Nyquist limit for sampling the RF waveform at the output of the amplifier 10, and for creating the predistorted RF carrier with the D/A converter 22, places the upper RF frequency limit at about 30 MHz.

Another practical limitation is the architecture of the master computer. High modulation frequencies and the need to maintain rapid cancellation impose a significant burden on the data bus that must carry sampled RF signals from the high-speed A/D converter 16 to the digital signal processor 18, and from the DSP to the D/A converter 22. In the present invention, the interface between the A/D and D/A converters and the DSP is the peripheral control bus interface (PCI) within the master computer. The master computer in the present embodiment of the invention is a desktop computer with a Pentium® processor operating at 100 MHz, though other state of the art computers can be configured to control the harmonic cancellation processor 14.

Stored in memory in the harmonic cancellation processor 14 are the machine readable instructions that implement the process that accomplishes the harmonic cancellation in the RF output signal from the transmission system. The present embodiment of the computer program comprises a main body for overall program control and several subroutines that perform signal generation, signal sampling and processing, harmonic analysis and correction.

The harmonic cancellation program creates an RF waveform by generating a frequency-domain matrix of a fundamental frequency and harmonics, converting this matrix data into time-domain data, and writing it to the very high speed D/A converter 22. The output of the D/A converter 22 is input to the high power amplifier 10, though persons skilled in the art will recognize that there may be signal conditioning and/or impedance matching elements interposed between the D/A converter 22 and the amplifier 10. The program controls sampling the output of the amplifier 10 in the time-domain and assembling a matrix of data representing the output signal. This matrix is converted to frequency-domain data by performing a Fast Fourier Transform (FFT), which identifies the harmonics of the amplifier output and the energy level of each harmonic. In a subroutine for computing the cancellation values for each harmonic, the frequency-domain matrix is processed through a correction calculation that takes into account a history value for each harmonic, the present level of energy in each harmonic, and uses the differences as coefficients in a correction calculation to yield a new value for each harmonic as a predistortion input into the amplifier.

This process may continue until each harmonic is suppressed to a level of 45 dBc or lower at the amplifier output (unfiltered). It may be kept running in a continuous loop to adapt the output of the amplifier to changes in the actual transfer function of the amplifier, which may be caused by changing electrical or environmental conditions. In this sense, the program is fully adaptive to the RF system in which it operates.

The present invention embodies the discovery that it is possible to effectively cancel harmonics in an RF amplifier output by employing a truncated analysis of arrays of complex values representing the amplitude and phase of individual harmonics in the input and output signals of the amplifier, then adjusting the input with predistortion to cancel harmonics generated in the amplifier. The discovery that the truncated analysis of the matrix signal data is capable of practical harmonic cancellation makes it possible to do the harmonic cancellation very fast, yet effectively.

The differential transfer function of a harmonic distorting amplifier at a given frequency and amplitude may be described through an N by N array of complex frequency domain terms where the term in the Kth row and the Lth column describes the ratio of the differential change in the Lth output harmonic caused by the differential change in the Kth input harmonic. While it is recognized that a full array of these terms is necessary to completely describe an RF power amplifier harmonic transfer function, this invention embodies the discovery that a correction computation using only those terms which lie along the diagonal of the array (K=L) will achieve harmonic cancellation in a closed loop system. This reduces the complexity of the harmonic transfer function array by N(N−1), where N is the number of harmonics considered.

Using the simplification of computing only the harmonic differentials on the diagonal of the array, it is possible to evaluate all of the complex terms along the diagonal in a single feedback cycle. The complex terms are the result of an FFT algorithm performed on the input and output time domain waveforms (sampled using a high accuracy A to D converter). The evaluation of each of the other terms (off the diagonal) would require N(N−1) additional cycles.

Through a combination of upsampling, sample length adjustment, fundamental frequency phase adjustment and down sampling again, a unique condition can be obtained where a single RF cycle is described by a time domain array of 64 data points (in the described embodiment) and the fundamental portion of that wave is a cosine wave of zero phase.

The invention recognizes that for virtually all practical communication signals, the ratio of the carrier frequency to the modulation frequency is very large. A simplifying assumption can be made that for any small number of RF cycles, the RF harmonic distortion terms are dominant over modulation products and completely describe the waveform. Using the conditions achieved by manipulating the RF cycle data (i.e., upsampling, phase adjustment, downsampling) and the assumptions about RF distortion dominating in the signal, each of the frequency domain terms of an FFT of this waveform describes a harmonic of the waveform.

Since the time domain waveform contains an exact integer number of cycles, the phase of each harmonic is described through a simple arc tangent of the real and imaginary parts of each term. This property greatly simplifies the evaluation of the transfer function diagonal in the matrix of complex signal terms. The computational efficiency of the algorithm is essential because the need for electronic harmonic cancellation is most acute for frequency agile signals where rapid switching of high power RF harmonic filters is difficult to implement without sacrificing size, weight and efficiency of a given RF system.

The present invention incorporates features which make modulation of harmonically cancelled signals practical. Recognizing that the harmonic transfer function of an amplifier is a mild function of instantaneous frequency (within a practical modulation bandwidth of the carrier), it is possible to frequency modulate the predistorted RF input waveform by simply modulating the clock frequency of the DAC clock. The predistortion waveform shape is unaffected because it is digitally stored. The need for additional cancellation under normal frequency modulation conditions is minimal.

Regarding amplitude modulation, empirical tests show that a given predistortion waveform remains cancelled to within 3 dB of the original levels over about 6 dB of output amplitude range. Using only two precalculated modulation waveforms, a modulation index of 75% can be accommodated without losing significant effectiveness. Further, since the cancellation algorithm incorporates automatic output leveling, the modulation distortion effects normally caused by output amplifier compression can be practically eliminated.

In the described embodiment of the invention, the harmonic cancellation program has been organized into a Main program having several subordinate subroutines. Other program organizational structures may be designed, of course, according to the advantages of a particular computer or programming language.

Figure 2:
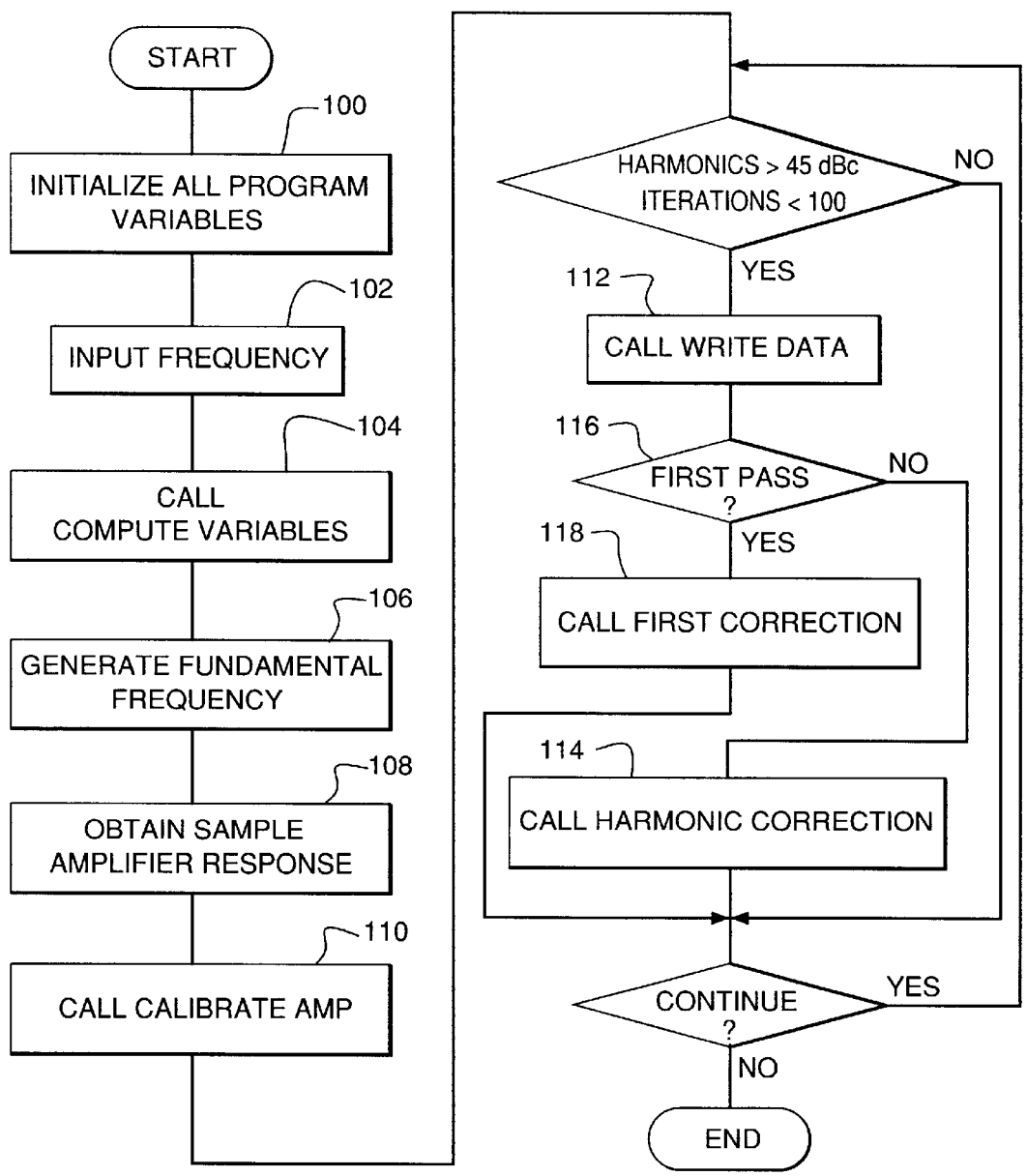
FIG. 2 is a flow chart of the MAIN program for operating the harmonic cancellation processor.

Referring to FIG. 2, the MAIN program initializes the harmonic signal processor, defines the variables that are used in the program, acquires a frequency value input from the system operator, then computes several frequency-dependent variables that are used throughout the program to generate and read RF signals. The frequency of operation is currently limited to HF frequencies (2–30 MHz), though advances in device speed and resolution, particularly for the A/D and D/A converters used for signal sampling and generation respectively, will permit higher frequency operation in the future.

Figure 3:
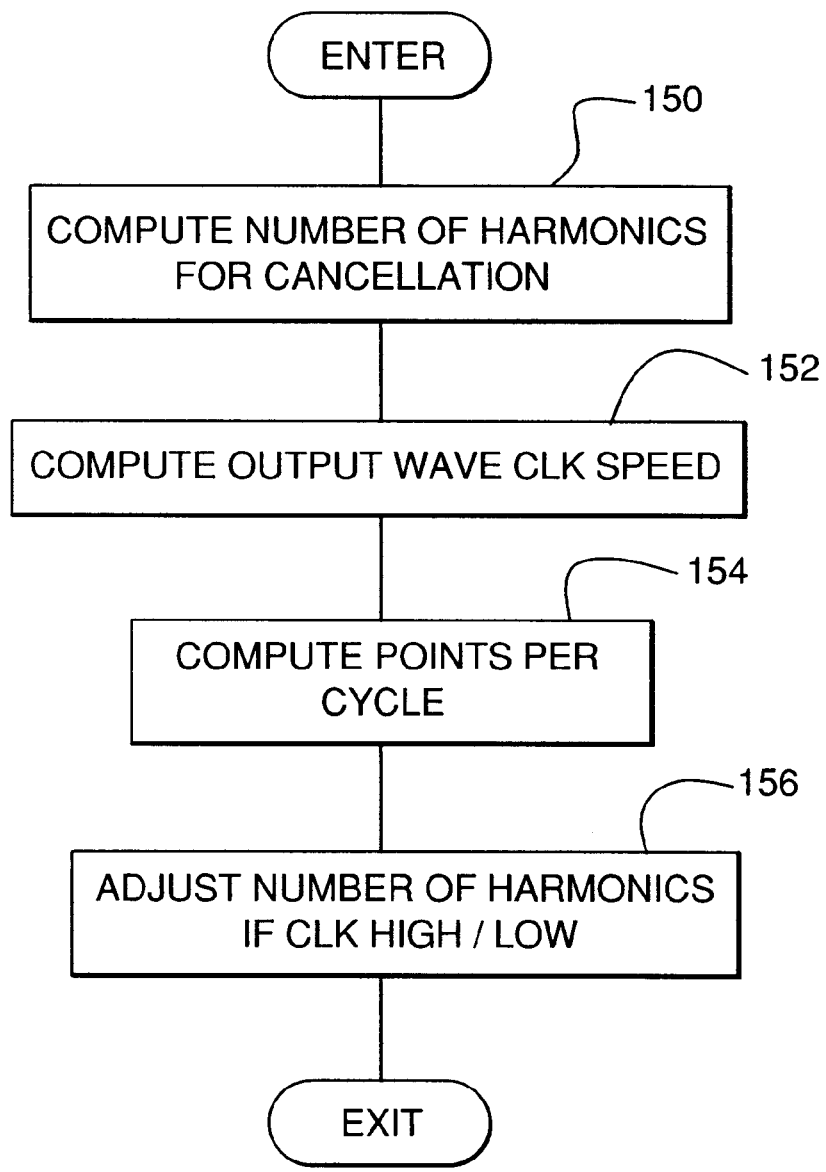
FIG. 3 is a flow chart of the subroutine COMPUTE VARIABLES.

Referring to FIGS. 3 through 6, there are subroutines and functions for performing the specialized tasks that are repetitively executed in the harmonic cancellation program. FIG. 3 illustrates a subroutine, termed COMPUTE VARIABLES for this description, that computes several parameters that figure prominently in later calculations. The number of harmonics for cancellation is determined based on the operating frequency. Other computations yield the number of data points in the RF sampled waveform on which analysis will be based. The number of points per cycle for the output waveform is also computed based on the operating frequency.

Figure 4:
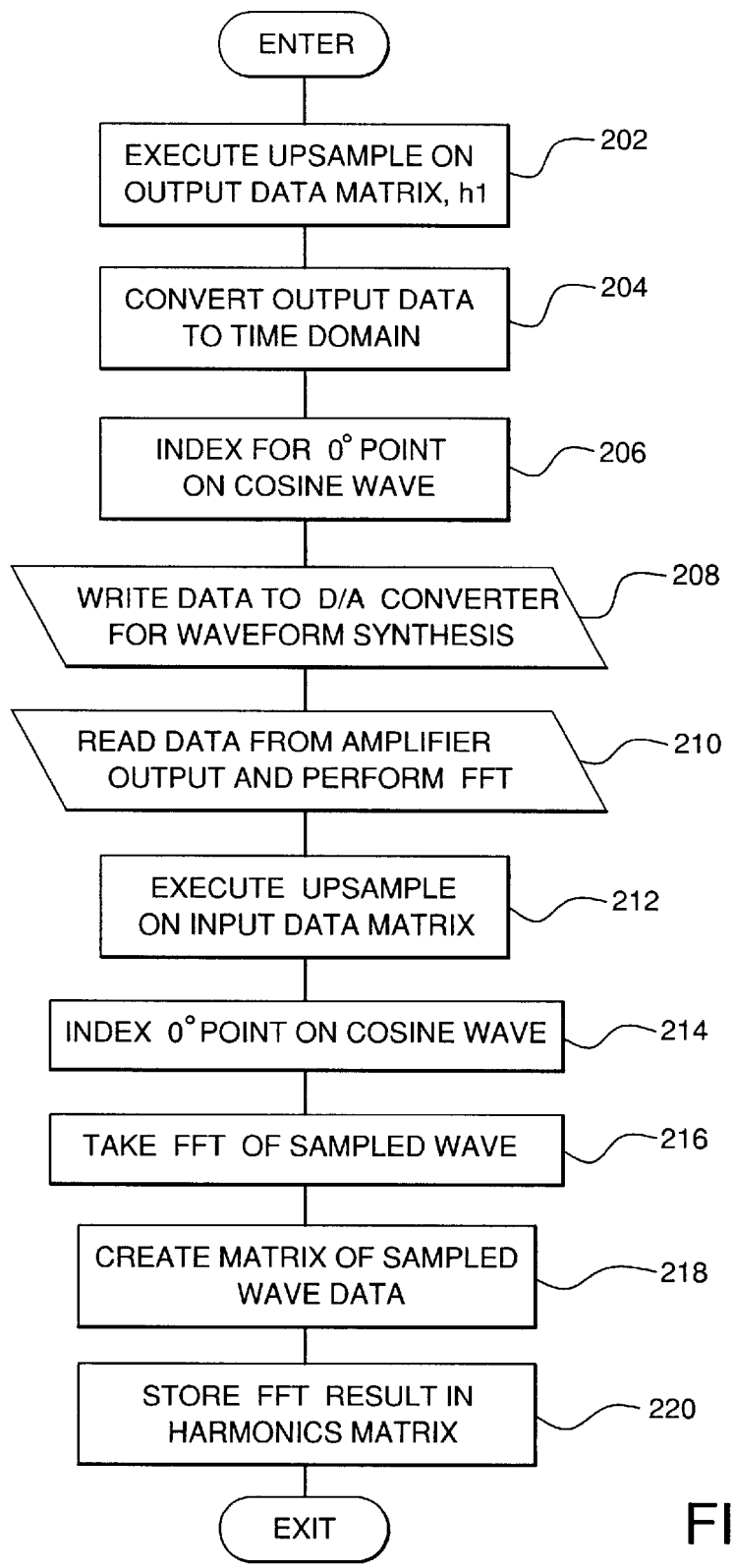
FIG. 4 is a flow chart of the subroutine WRITE DATA.

FIG. 4 illustrates a subroutine, called WRITE DATA in this description, that formats frequency-domain into time-domain data for output to the D/A converter for synthesis of the RF waveform that is input to the high power amplifier. This subroutine also reads sampled data from the amplifier output and begins the process of determining its harmonic content such that correction may be performed.

Figure 5:
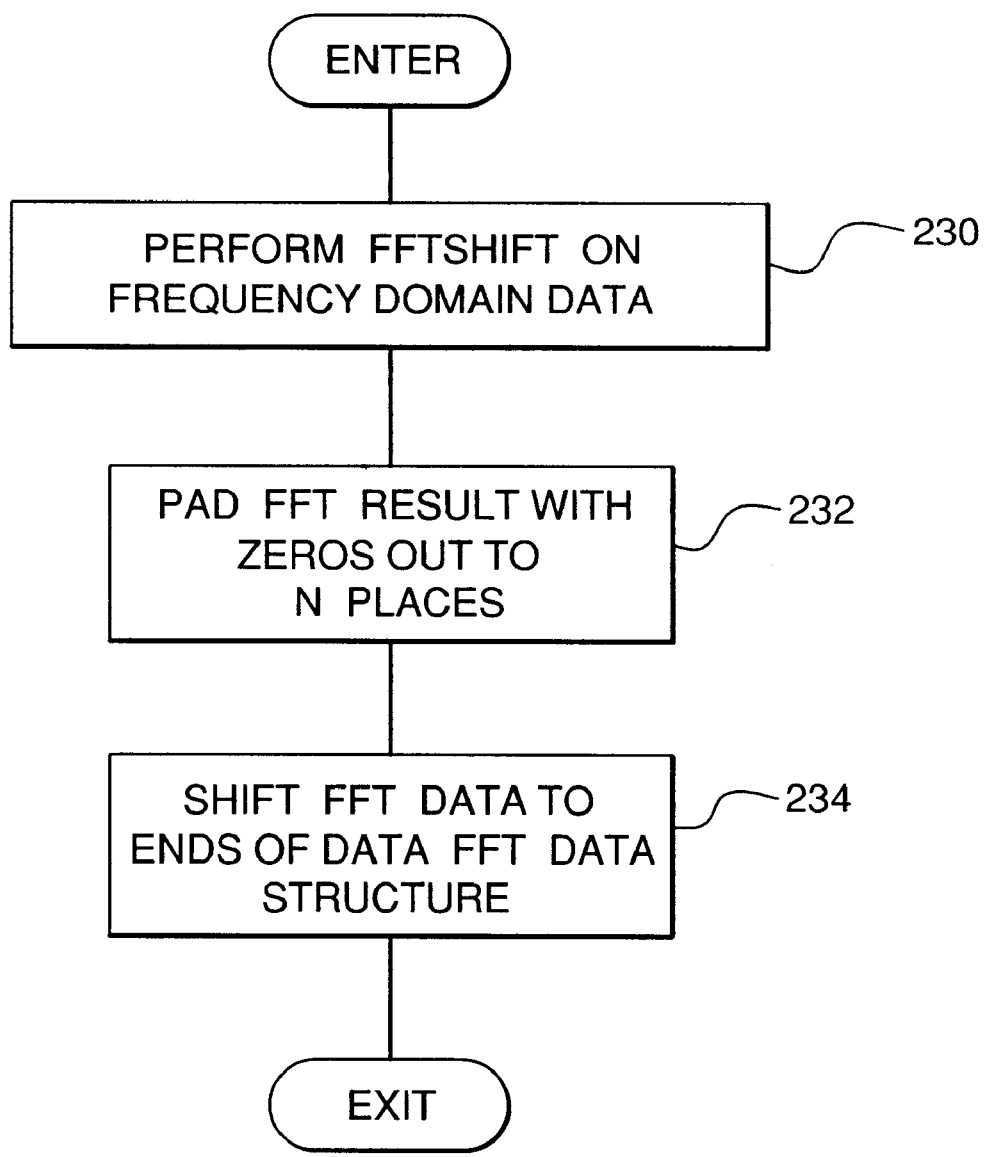
FIG. 5 is a flow chart of the subroutine UPSAMPLE.

FIG. 5 illustrates a subroutine, called UPSAMPLE in this description, that expands the frequency-domain representation of a signal from its limited-sample form out to a larger-scale representation to increase the resolution. In the present embodiment of the invention, the waveform is expanded to 512 samples and the FFT results shifted from their nominal sample base into this larger domain. This subroutine in used in several places, but, in general, it is used to create additional interpolated data points so that waveform arrays are compatible with hardware, or so that more precise calculations can be performed on time-domain data.

Figure 6:
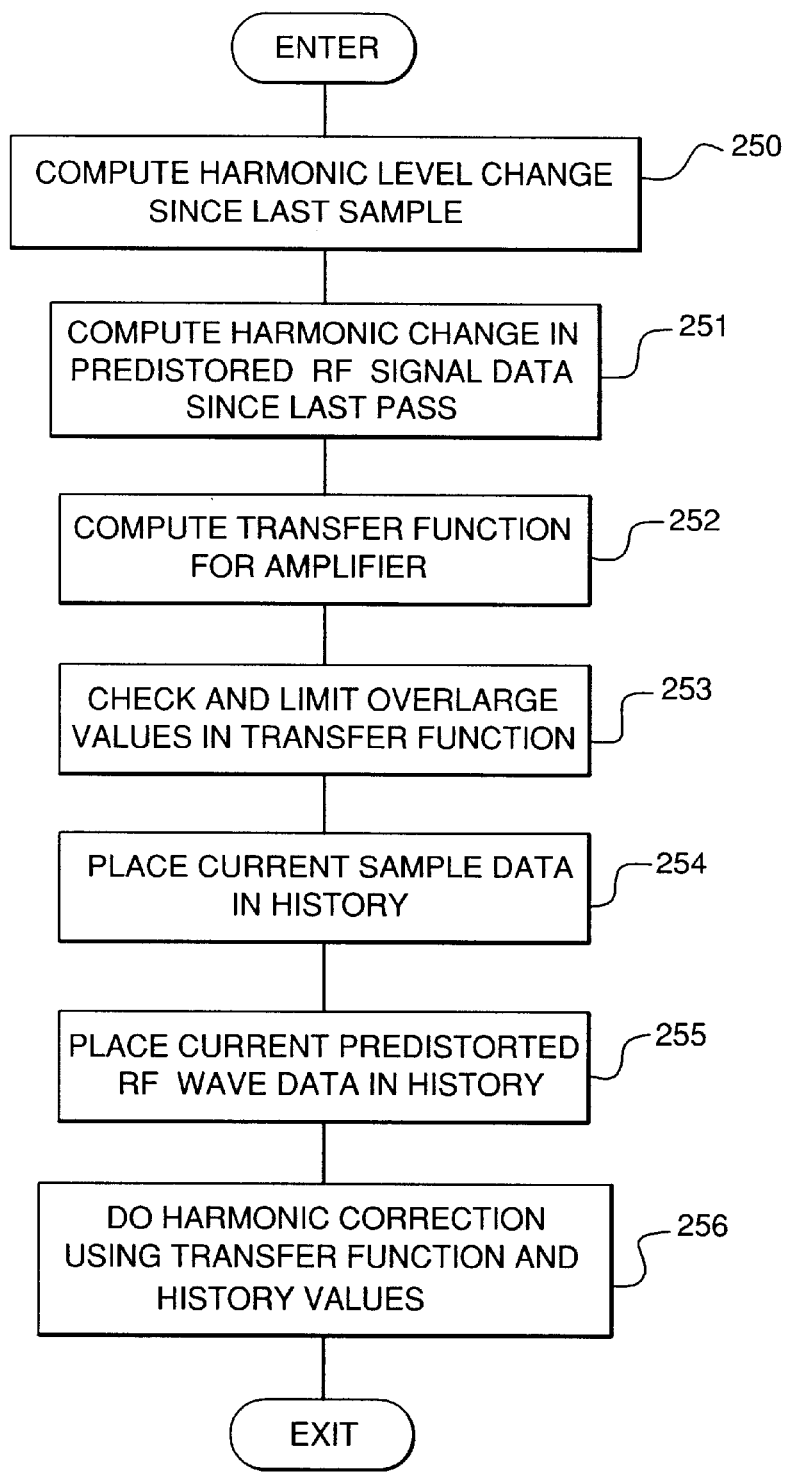
FIG. 6 is a flow chart of the function HARMONIC CORRECTION.

FIG. 6 illustrates a subroutine, called HARMONIC CORRECTION in this description, that operates on the waveform data to determine the change in harmonic content in the output RF waveform and make corrections that are applied to the input data as predistortion. The routine applies the correction to each harmonic individually in the frequency-domain before the signal is returned to a time-domain dataset for output to the D/A converter and synthesized into RF.

The detailed operation of the harmonic cancellation program will now be described. It should be clear to those of skill in the art that references to particular variable names, data structures, functions and routines are generic to the described embodiment of this program and are intended for convenience of identification. None of the variables, functions and routines described herein need be so designated in any application of the invention. Furthermore, the flow charts shown in the Figures are illustrations only and do not restrict the scope of the present invention.

The several sections of machine instruction code appearing before the claims below are included for clarity in this description. Shown coded in MATLAB language, these code sections are intended to show an example machine language sequence that embodies the harmonic cancellation method described herein. It will be clear to one skilled in the art that the operational mechanics implemented under control of the described program can be achieved using an infinite variety of program codes and structures. Reference to the claims, in the context of the detailed description below, defines the scope of the invention.

In the MAIN program (See FIG. 2), several variables are identified for global recognition and use in the program and are initialized in the first program step 100. Among the variables initialized are the following defining several key parameters:

| | |
|---|---|
| h: | number of harmonics to cancel |
| h1: | output waveform for RF synthesis |
| h2: | sampled RF input waveform from amplifier |
| f: | frequency of operation |
| h1delta: | difference between h1 history and current value |
| h2delta: | difference between h2 history and current value |
| desired: | objective variable (describes the final output) |
| xfer: | transfer function coefficient |

Values are assigned to certain key variables, including a minimum dB level of harmonic suppression to be achieved (−45 dBc [min_dB=45]), number of iterations of the harmonic cancellation convergence [iter=0], the number of points in each input sample matrix to be analyzed [pts=64]. The number of points for analysis may be altered somewhat depending on the RF operation frequency, which will be apparent in an early calculation.

The next major step 102 is the selection of the RF frequency of operation. The frequency is normally selected by the system operator. The selected frequency affects nearly everything that follows, and certainly affects the number of harmonics for cancellation processing, the number of sampled points evaluated for each cycle of RF wave, and the amplifier response model. Each time the frequency of operation changes, the program must return to this point to begin the harmonic cancellation process over again. In the case of frequency modulation, where frequency changes are less than about 10 percent of the center frequency, only the clock frequency of the DAC needs to change to achieve modulation frequency changes. The cancellation waveform does not have to be recomputed. For larger changes, the algorithm must be initiated again in order to maintain good cancellation.

With the operating frequency selected, several variable parameters may be computed in the next step 104 to prepare for harmonic cancellation. In the present program, the subroutine COMPUTE VARIABLES performs this task (See FIGS. 2 and 3).

First, the number of harmonics to be cancelled is determined 150. This is a frequency dependent number. If the operating frequency is 2 MHz, it may be necessary to cancel up to 14 harmonics in an HF system because the 14th harmonic of 2 MHz is within the HF band. A low-pass filter at the high power amplifier output serves to attenuate the harmonics over 30 MHz. If the operating frequency is 13 MHz, only the second harmonic is in-band so processing for cancellation of only the second harmonic is necessary. In order to generalize the calculation of the highest harmonic which can be canceled, the program recognizes that this is determined by the input bandwidth of the A/D converter, which is 30 MHz.

A clock frequency (clk) is calculated 152 that will be the external clock for the D/A converter synthesizing the output waveform from the harmonic cancellation processor into the amplifier. The calculation is:

$$clk = freq \times points/cycle$$

where "freq" is the operating frequency, "points" is the number of points of data representing the RF waveform, and "cycle" is the integer number of cycles to be described in a 64 point waveform record which is passed to the DAC. For example, if the operating frequency is 2 MHz, the DAC clock will be 128 MHz. The value of "clk" is adjusted up or down if the initial value is below 80 or above 130 MHz. To adjust upward, the value of "points" is increased by eight; to adjust down the value of "cycle" is increased by one. Then "clk" is computed again.

The variable "cycle" represents the number of RF cycles to be described by one 64 point block of waveform data. The arbitrary waveform generator (DAC) uses a fixed, 64 point data buffer. In order to achieve a wide range of output frequencies while maintaining the waveform generator clock within a range of 64 to 128 MHz, the number of fundamental frequency RF cycles described in the data buffer is made an integer variable.

In the next step 154, the variable "ppc" (points per cycle) is set to the nearest even integer to simplify later data conversions. The variable ppc represents the number of digital data words used to describe a single cycle of the RF input waveform. It is a variable because it is related to the desired input frequency. It is desirable to make ppc as high as possible but due to maximum clock rate limitations of the arbitrary waveform generator (DAC), it usually takes on values between 4 and 64. The value of "ppc" represents a calculated optimal number of digital data points, which describe one full cycle of the desired frequency. It is instrumental in maintaining integer relationships between the analog waveforms and the digital signals. This acts to reduce spectral leakage and spurious signals when converting between various signal formats including analog, digital frequency-domain and digital time-domain.

The clock (clk_gs in the sample program code) for the A/D converter is then refined in the next step 156 so that an integer number of data points describes the fundamental frequency portion of the waveform to be captured. This improves spectral purity for signal processing. Since this may have an impact on the number of harmonics which can be canceled, this is recomputed using the refined A/D clock rate. Upon completion of the COMPUTE VARIABLES subroutine, control returns to the MAIN program.

Referring to the MAIN program (FIG. 2), the next step 106 is the generation of the data structure ("wave") that represents the fundamental frequency corresponding to the selected operating frequency of the communications system. A time-domain representation of the fundamental waveform is calculated in cosine wave form. In the program, the calculation appears as follows:

$$wave = [wave; 0.5 \cos(2*pi*(i-1)/(ppc))]$$

where "wave" is the data structure for storing the information, "pi" is the mathematical value associated with the trigonometric constant π, and "ppc" is the variable name for points per cycle that was calculated in the COMPUTE VARIABLES subroutine. The array "wave" describes one cycle of a cosine wave which is ultimately sent to the waveform generator (D/A converter 22 in FIG. 1) for conversion into an analog signal input to the RF amplifier. Array "wave" is ppc points long and is in time-domain format.

After the time-domain calculation is complete, a frequency-domain matrix is created to contain the output waveform. In the present program, the matrix h1 is the frequency-domain data structure for the output waveform. This matrix is updated each time corrections are made to the output waveform to adjust the harmonic content of the waveform sent to the amplifier 10. In the creation operation, the matrix is filled using the following functional expression:

$$h1 = fft\ (wave, ppc).*(2/ppc)$$

where "fft" invokes a function that performs a Fourier transform on the time-domain value in "wave". The function "fft" is an internal MATLAB function which is performed in a conventional manner.

FFT(X) is a MATLAB function used to convert a time-domain waveform to its frequency-domain components. Some mathematical operations on digitally sampled waveforms are more easily performed in the frequency-domain. IFFT(X) reverses the FFT(X) process. FFT(X) is the discrete Fourier transform of vector X. If the length of vector X is power of two, a radix-2 fast-Fourier transform algorithm is used. If the length of X is not a power of two, a slower non-power-of-two algorithm is employed. FFT (X,N) is the N-point FFT, padded with zeros if X has less than N points and truncated if it has more. If X is a matrix, the FFT operation is applied to each column.

The next program module 108 in the MAIN program develops an objective variable called "desired." This is a frequency-domain representation in an FFT output format of the preferred output harmonic spectrum in terms of an array. The array is configured in an FFT output format. The first term of the array is the "DC" level and is set to zero. The second term describes the fundamental level and is set to one (normalized to the desired output power level). All subsequent terms are set to zero. These are the desired harmonic output levels in order of harmonic number. As the harmonic cancellation algorithm progresses, successive output spectrums are compared with "desired" to produce an error vector. Also, within this module, the variable "ppc" is utilized again.

The next step 110 in the MAIN program is the call to a subroutine for calibrating elements in the program for the actual input gain response of the amplifier. The CALIBRATE AMPLIFIER subroutine is used to insure that the gain between the arbitrary waveform generator (the DAC signal source 22) and the power amplifier 10 is sufficient to achieve the desired RF output power. For example, if the gain is too low, the arbitrary waveform generator (DAC) can not generate a sufficiently large signal to result in the desired output level. In the preferred embodiment described herein, the desired output level is about 110 Watts of fundamental energy. If the gain is too high, the arbitrary waveform generator (DAC) is forced to generate smaller signals. These signals do not allow the generator to achieve the fidelity necessary to achieve the best harmonic cancellation.

In the CALIBRATE AMPLIFIER subroutine (see FIG. 7), a variable (desired_power) is set 260 to define the desired output power from the RF power amplifier. A nominal first value for power correction is defined too. This value will be changed when the actual power output if measured. The fundamental frequency waveform array h1 is then operated upon 262 by the UPSAMPLE subroutine to prepare for scaling the amplitude of the signal data points to adjust the power produced by the D/A converter and amplifier. Once the contents of the signal array is scaled 264, the signal data is written out 266 to the D/A converter 22 creating a signal to be amplified. Then the amplified RF signal is sampled and read 268 by the A/D converter 16 into a new data array (theData). These data points are processed 270 to determine the power of the post-amplifier signal. A comparison of the measured power to the desired power is made 272 and a new power correction factor is set. This calibration is run until the output power is very close to the desired value 274. The code segments for writing data to the D/A signal generator and for reading from the RF A/D converter are the same as those in the WRITE DATA subroutine described and listed below.

UPSAMPLE (see FIG. 5) operates on the frequency-domain array of a waveform. It is used in conjunction with FFT and IFFT to change the number of data points used to describe a given waveform. For example, if one period of a waveform is captured using an A/D converter using 30 points, it can be resampled to 64 points by using FFT followed by UPSAMPLE(64) and finally IFFT. The result will be the same waveform using 64 points.

The Cancellation Loop

Once the amplifier response has been approximated based upon the analysis of its frequency output, the harmonic cancellation can begin. The cancellation is performed in a convergence loop that continues until the harmonic frequencies have been suppressed greater than 45 dB in relation to the fundamental frequency. In the present program, the loop is coded to allow for up to one hundred iterations of the harmonic cancellation loop for convergence, but the typical convergence requires only a few iterations to be successful. There are frequencies and/or amplifiers that have required only two or three iterations for effective harmonic suppression. This means that the cancellation of the harmonics in an output wave from the amplifier can be accomplished in a matter of milliseconds in a real-time, adaptive program that can continually compensate for fluctuations in amplifier response caused by external factors.

There are two major steps performed on each pass through the cancellation loop. (See FIG. 2.) The RF waveform data must be sent out to the D/A converter to synthesize the latest predistorted version of the RF waveform, and the output of the amplifier must be sampled to acquire new waveform input data for analysis. These operations are performed in the present program by a subroutine called WRITE DATA 112 (FIG. 2). The second major step is the harmonic cancellation processing itself, which is performed in a subroutine called HARMONIC CORRECTION 114 in this description of the present program.

Before executing the main elements of the correction loop, the program increments the count of the control variable "iter," the number that tracks how many iterations through the loop have been performed. "Iter" was initialized to zero at the beginning of the MAIN program. On the first pass into the cancellation loop, "iter" is incremented to one. On the first pass, certain operations that are only performed on that pass are executed. Subsequent iterations are performed in a standard manner.

Waveform Output/input

When the MAIN program calls WRITE DATA (see FIG. 4), the input to the subroutine is the matrix of waveform data that will be output to the D/A converter to synthesize the RF waveform to the amplifier. This matrix is called h1 in the present program. In WRITE DATA, the h1 data is sent to the D/A to produce the RF waveform, then the subroutine reads sampled RF feedback waveform data into the harmonic cancellation processor for analysis. A new matrix, h2, is created that contains the frequency-domain representation of the high power amplifier output.

The first step 202 in WRITE DATA is a scaling and time adjustment step intended to properly determine the 0° point in the cosine wave data in the h1 matrix that is passed out to the D/A converter. The waveform matrix h1 was created in the MAIN program and is the fundamental frequency waveform in digital terms. It will be changed during the harmonic correction operation. The nominal number of frequency-domain data points for any frequency is 64 points, though the value (represented by the variable "points") may range from 58 to 70. There is not enough resolution in this number of samples to accurately locate the 0° phase point in a cosine wave. It is necessary to simulate an oversampled waveform to perform this task. This is the purpose of a function termed UPSAMPLE in the program.

Referring to FIG. 5, two data parameters are passed to the UPSAMPLE function. The first is the data structure to be operated upon, in this case h1, the matrix of output waveform data. The second parameter is the number "N" of samples into which to extrapolate the data from the original 64 (or other figure) of points. In the present program, the UPSAMPLE function extends the data to 512 points.

In the frequency-domain (after the FFT on a time-domain sampled signal data structure), the signal is represented by two symmetrical vectors with DC on the left (zero frequency) edge, but no DC term on the right edge. The first step 230 in the UPSAMPLE function is to shift the FFT data result to the center of the axis. This is accomplished by another function called FFTSHIFT, which operates on the waveform data matrix that was passed to the UPSAMPLE function. In the presently preferred program, FFTSHIFT is a MATLAB function. In the program, it is used to simplify the subsequent mathematical operations on the output of the FFT function. Due to mathematical convention, the output of an FFT places the odd "DC" or "zeroth lag" term on the left hand side of the output array. There is no symmetrical term on the right hand side. FFTSHIFT effectively moves the DC term to the center of the array.

After shifting the FFT data, the waveform matrix is extended to its desired length by a function called ZERO PAD 232. This MATLAB file is used to ensure the size of an array used in a subsequent FFT function satisfies the restrictions of an FFT. If this is not done, and the array length is not an even power of two, a discrete Fourier transform must be used. This achieves the desired result as well, but is computationally less efficient.

Finally, UPSAMPLE shifts the FFT data to the ends of the scale 234 by executing the function FFTSHIFT once again on the now extended waveform matrix. After this operation, UPSAMPLE returns the resulting oversampled matrix to the subroutine WRITE DATA.

Referring back to FIG. 4, after execution of the UPSAMPLE function, the new waveform matrix ("h1_up" in the program) is converted 204 to time-domain values that are placed in another data matrix, indexed to locate the 0° point in the cosine wave 206, and checked for over-range values that must be clipped before being sent to the D/A converter. Then, the waveform data is clocked out 208 to the D/A for synthesis of an RF waveform in the time-domain.

Figure 7:
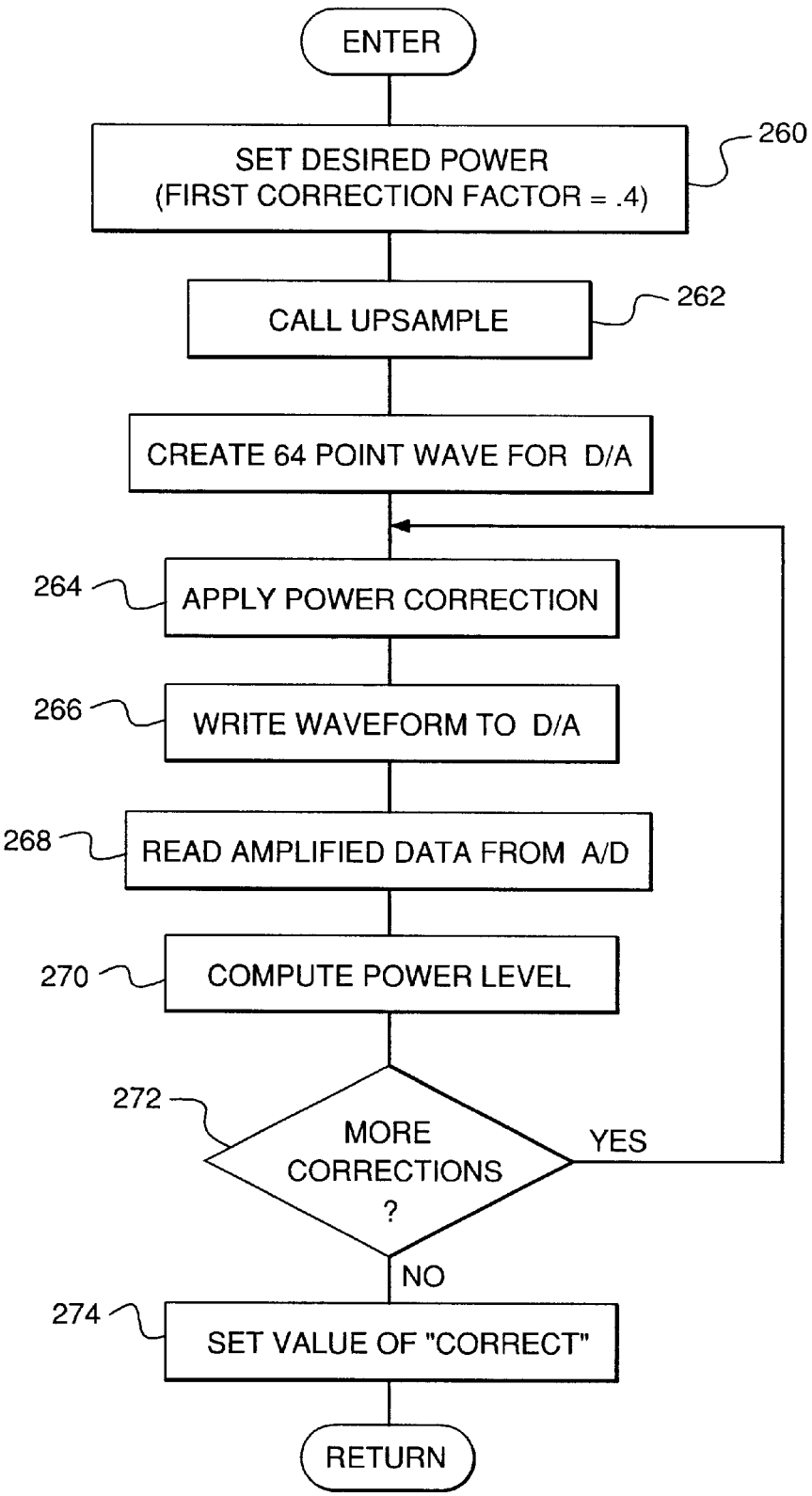
FIG. 7 is a flow chart of the function CALIBRATE AMPLIFIER.
Figure 8B:
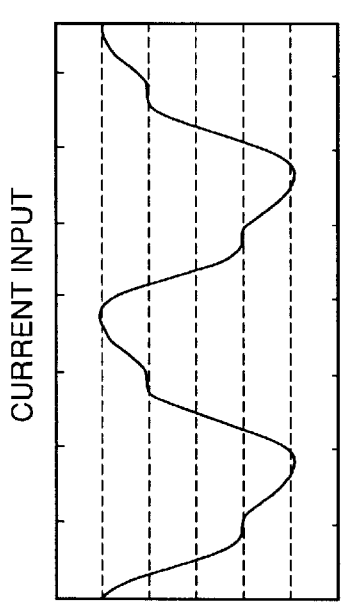
FIG. 8b is a time and frequency-domain chart for the output signal from the RF amplifier in a harmonic cancellation system without harmonic correction in progress.
Figure 8B:
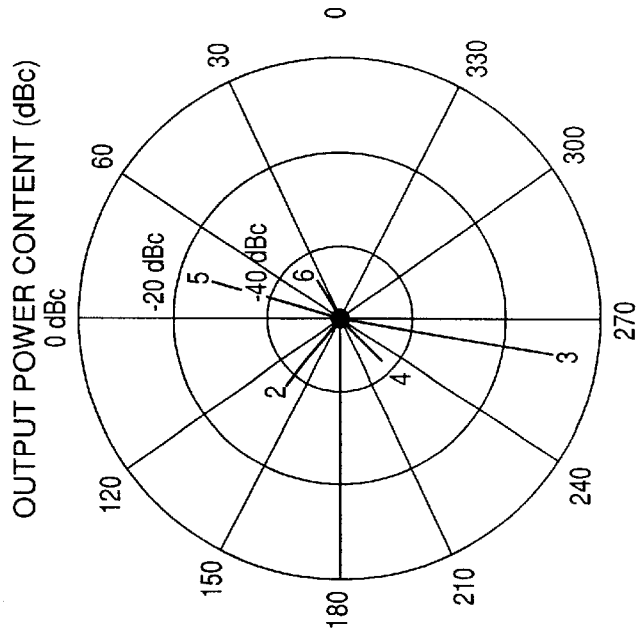
Figure 8A:
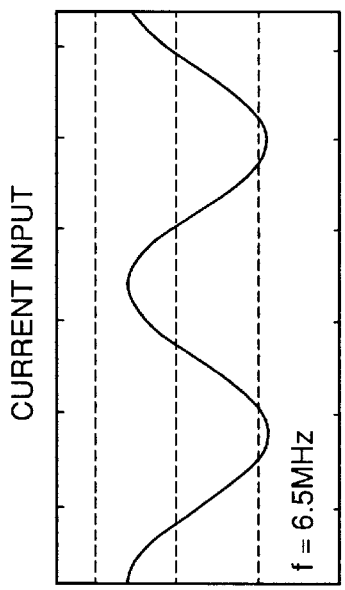
FIG. 8a is a time and frequency-domain chart for an input signal to the RF amplifier in a harmonic cancellation system without harmonic correction in progress.
Figure 8A:
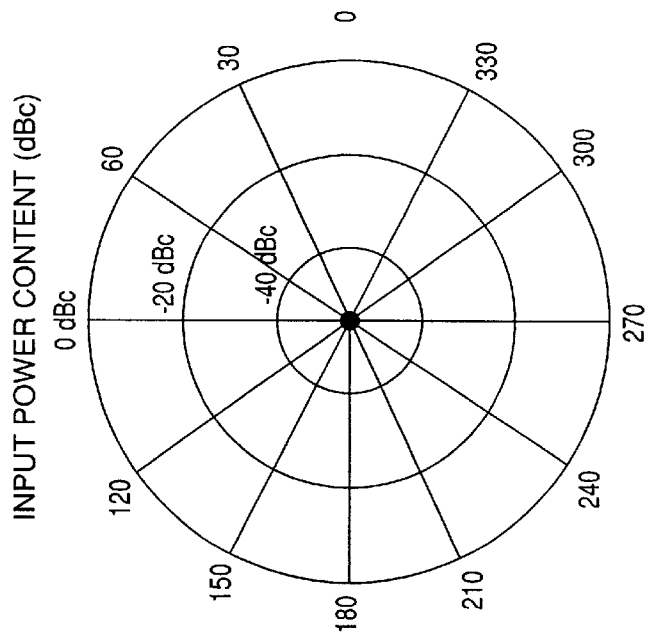

The zero degree indexing of the fundamental portion of the output waveform array is done to facilitate the display of the harmonic vectors on a polar plot (See FIGS. 7 and 8). In this way, changes in the phase of the harmonics can be more easily observed. In addition, the check for over-range values in the D/A waveform array is done to limit distortion. Unlike analog amplifiers, D/A converters do not over-range gracefully. Instead of limiting at voltage extremes, they tend to start over from zero amplitude. In the present invention these instances are converted to a limiting value and a limit message is generated. In some cases, it is possible to experience a D/A converter over-range situation during intermediate stages of cancellation while not having this problem at the end. The cancellation algorithm can tolerate moderate signal clipping but not over range.

Immediately after the output operation to generate the RF waveform, an input operation 210 is performed in which sampled data is gathered from the RF amplifier output. This time-domain data is placed in a data matrix ("theData" in the program) for processing. The data is immediately moved to a new matrix limited to a size equal to one cycle of the operating frequency waveform. Then, an FFT is performed on the single cycle of sampled wave information and the result is scaled. The FFT is performed on a single cycle of information because it is computationally more efficient if redundant data is removed. For a single fundamental cycle, the output array contains harmonic information in every index location. If two cycles were used, then every other array element would be zero. Scaling factors on both FFT and IFFT operations are needed to remove the summing distribution effects of the correlation and anti correlation operations within the FFT.

The function UPSAMPLE is executed on the FFT result 212, once again simulating an oversampled waveform of 512 data points. The sampled waveform is converted to time-domain and scaled up in magnitude. ((step1__up__t= (real(ifft(step1__up))).*(512/2)) The data is indexed 214 for the 0° phase point of the cosine wave and the DC term reinjected for symmetry. Another FFT is performed 216 on the oversampled data to convert back to frequency-domain, then the data is truncated 218 down to the number of points, nominally 64, used in the harmonic correction routine. The final matrix of data to be used in the harmonic correction subroutine is termed h2 in the present program and is the product 220 of the subroutine WRITE DATA.

Harmonic Correction

Referring again to the MAIN program (FIG. 2), the first check 116 after WRITE DATA determines whether this is the first pass through the correction loop. If so, the subroutine HARMONIC CORRECTION FIRST is called 118. If this is the second or later entry into the loop, the subroutine HARMONIC CORRECTION is called.

HC__FIRST is a subroutine executed on only the first pass through the harmonic correction program segment. The first cancellation iteration must operate without knowledge of the harmonic transfer function of the amplifier chain. A simplified distortion model is assumed such that the output distortion products are simply inverted in phase and applied to the input, scaled by the gain at the fundamental frequency. This achieves two goals. First, it usually provides some harmonic cancellation although repetitive application of this technique does not usually converge to acceptable cancellation levels. Second, it provides harmonic stimulus to the amplifier necessary for calculation of its incremental harmonic transfer function. The code segment for HC__FIRST is among the program listings below.

On subsequent entries into the cancellation loop the subroutine HARMONIC CORRECTION is executed. This is where the operation to adaptively apply a corrective value to the output waveform is performed. Referring to FIG. 6, on entry into the routine, the frequency-domain data matrix constructed by WRITE DATA (h2), the frequency-domain sampled RF waveform from the amplifier, is the raw data for analysis. The final output of subroutine HARMONIC CORRECTION is a data matrix (h1) containing a frequency-domain digital representation of a predistorted RF waveform for input into the RF amplifier 10. The elements of h1 and h2 are complex, since they represent both the amplitude and phase of each harmonic in the frequency domain.

The first operation 250 is the determination of the difference between the values of each element (harmonic) in the present h2 matrix compared to the most recent history of those values on the last pass (h2old) [the operation is: h2-h2old]. These difference values are placed in a matrix called h2delta, which has as many elements as there are harmonics to be canceled. The difference is computed for 2 to h+1 elements, where h is the number of harmonics calculated in COMPUTE VARIABLES. A similar operation 251 is performed for the present and history values of h1, the waveform most recently sent to the RF amplifier by the program, yielding another data structure called h1delta [hidelta =h1−h1old, for 2 to h+1 elements].

These two matrices, h2delta and h1delta, contain the data that is used to compute a transfer function coefficient for each harmonic in the signal that is unique to this pass through the cancellation loop. This transfer function coefficient is new for each pass through the harmonic cancellation operation. That is an important element of the real-time adaptive nature of the program.

The transfer function coefficient for each harmonic is computed next using the information in the h1delta and h2delta matrices. The operation 252 is:

$$xfer=(h2delta/h1delta)$$

where xfer is a data structure for storing the transfer function coefficients for each harmonic of the operating frequency. Element by element, the harmonic content changes stored in the hidelta and h2delta matrices are processed to yield a corresponding value for "xfer", until there is a value of "xfer" for each harmonic.

It is important to note that the calculation of the changes between harmonic content in the current and history data structures for the waveform, and the calculation of the transfer function coefficients, are performed for each harmonic individually. This technique may be described as limited matrix computation to characterize the dynamic transfer function of the RF power amplifier during convergence. Differentiation for each term of the series (i.e., each harmonic) is obtained through subtraction of the current and previous harmonic measurements in the complex plane.

The simplicity and speed of this method is a product of an approach to the analysis that discounts the effects of computational terms that, if included, would describe the relationship between different harmonics. In the present invention, these terms are ignored and effectively assumed to have a value of zero. This reduces the tests needed to establish each new estimate of the transfer function from N (where N is the number of harmonics) to one. It was assumed that harmonic cross-coupling in the RF power amplifier was small enough so that cross-coupling terms can be ignored without seriously degrading the performance of the convergence. Laboratory trials have confirmed the assumption. Thus, all of the processing steps are limited to discrete harmonics in the signal without inclusion of any factors for cross coupled harmonics.

There may be two checks 253 in the HARMONIC CORRECTION subroutine to prevent sudden large changes in harmonic content from skewing the convergence to a point from which it might be impossible to recover. Each value of "xfer" may be checked 253 to determine if an abnormally large or small instantaneous correction factor has been calculated for any harmonic. If so, a limiting figure is substituted for the large value to keep the convergence under control.

In two successive loops, the high and low limits may be tested. First, a high limit of 6 is placed in a variable called "transmax. " Then, for each harmonic, the absolute value of the vector "xfer", a complex plane figure, is placed in a dummy matrix "tr". The absolute value figure is next compared to the figure $10^{(transmax/20)}$ for each harmonic. If greater than that figure, the value of xfer for that harmonic is changed as follows:

$$xfer=(xfer*(10^{(transmax/20)}))/tr$$

where "xfer" and transmax are parameters defined above, and "tr" is the absolute value of "xfer" stored in the dummy matrix. The same check can be made for correction coefficients in the matrix "xfer" that might be negative values. A limiting value, transmin, is set to 0.1. Once again the absolute value of the complex term "xfer" is stored in a dummy matrix "tr" for each harmonic. If, for any harmonic, the value of "tr" is less than $10^{(transmin/20)}$, the value of "xfer" is changed:

$$xfer=(xfer*(10^{(transmin/20)}))/tr$$

With the foregoing protection against an anomalous value defeating the convergence, the correction routine can conclude by constructing a new waveform matrix for output to the RF amplifier. Before the final waveform is constructed, the waveform history matrices are updated. The current values of the output and input waveforms (h1 and h2) are transferred 254, 255 into the waveform history value matrices (h1old and h2old), where they will be used in the next iteration of the convergence.

The final step 256 of the subroutine HARMONIC CORRECTION is the building of the new waveform matrix with frequency-domain values for each harmonic of the signal. This matrix, when complete, is a predistorted RF signal for input into the RF amplifier where the predistortion counterbalances the harmonic energy that would ordinarily be produced in the amplifier.

In the step that builds the new waveform, the most recent history output waveform (h1old, just updated above) is adjusted for each harmonic by the following factor: the quotient of the desired harmonic level less the current measured harmonic (h2) and the correction factor "xfer".

$$h1 = h1old + \frac{(desired - h2)}{xfer}$$

The result of this operation is a new waveform matrix, h1, corrected for the latest measured harmonic content of the sampled RF amplifier output, h2.

The correction factor "xfer" is developed by making an element by element complex quotient of the differences between the previous and current input waveforms and the previous and current output waveforms. Since the waveforms are expressed in the frequency-domain, the elements of these arrays represent the amplitude and phase of individual harmonics. "xfer" describes the relationship between changes in input harmonics and changes in output harmonics. "xfer" can be expressed as a diagonal matrix with input harmonics describing each row and output harmonics describing each column. Matrix locations off the diagonal are assigned a zero value. This transfer model assumes no cross coupling between different numbered harmonics.

While analysis shows that there is some cross coupling, ignoring these terms is a critical simplifying assumption which does not preclude or significantly impede convergence of the algorithm. Rather, it makes the algorithm practical by reducing both mathematical operations and signal measurement iterations by a factor of N squared, where N is the number of harmonics to be canceled. "xfer" may be thought of as a delta transfer function because it is derived from incremental changes between the input and output of the amplifier.

Likewise, the correction to be added to the waveform in the next iteration is also a delta which represents the difference between the current output waveform and the objective variable "desired. " This difference is modified by "xfer" on a harmonic by harmonic basis before being added to the previous input waveform to form the new one.

At the conclusion of the HARMONIC CORRECTION subroutine, the MAIN program loops back to call the WRITE DATA subroutine again. The new output waveform h1 is written to the D/A converter to synthesize the RF signal into the RF amplifier 10, the amplifier output is sampled and read into memory, and the HARMONIC CORRECTION subroutine processes another correction to the predistorted waveform. This process may continue until a new operating frequency is selected.

Figure 9B:
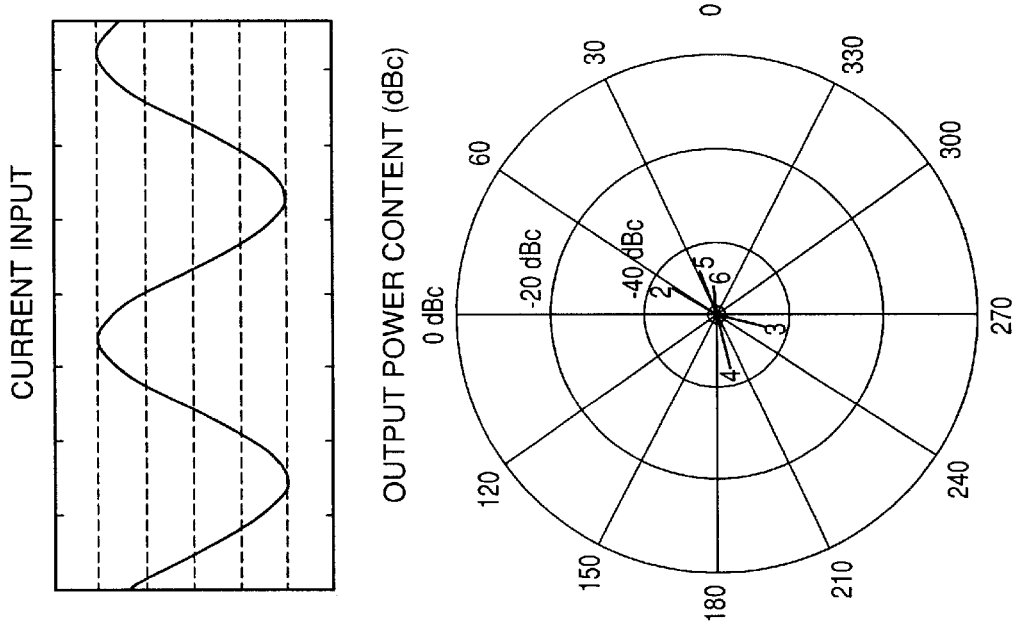
FIG. 9b is a time and frequency-domain chart for the output of the RF amplifier in the harmonic cancellation system of the invention.
Figure 9A:
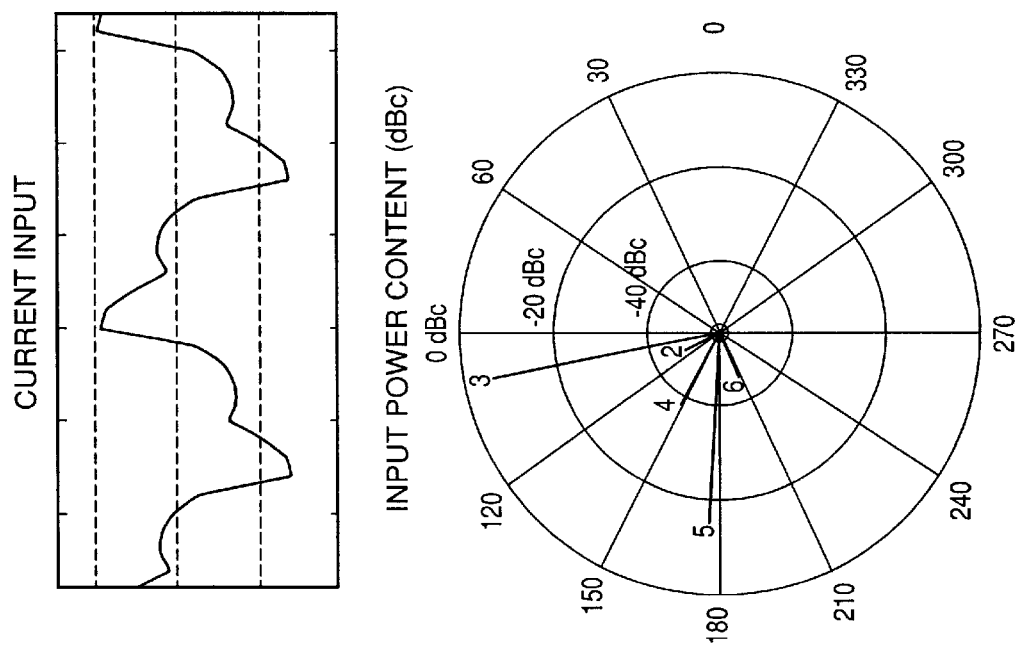
FIG. 9a is a time and frequency-domain chart for the input signal into the RF amplifier generated by the harmonic cancellation system of the invention.
Figure 10:
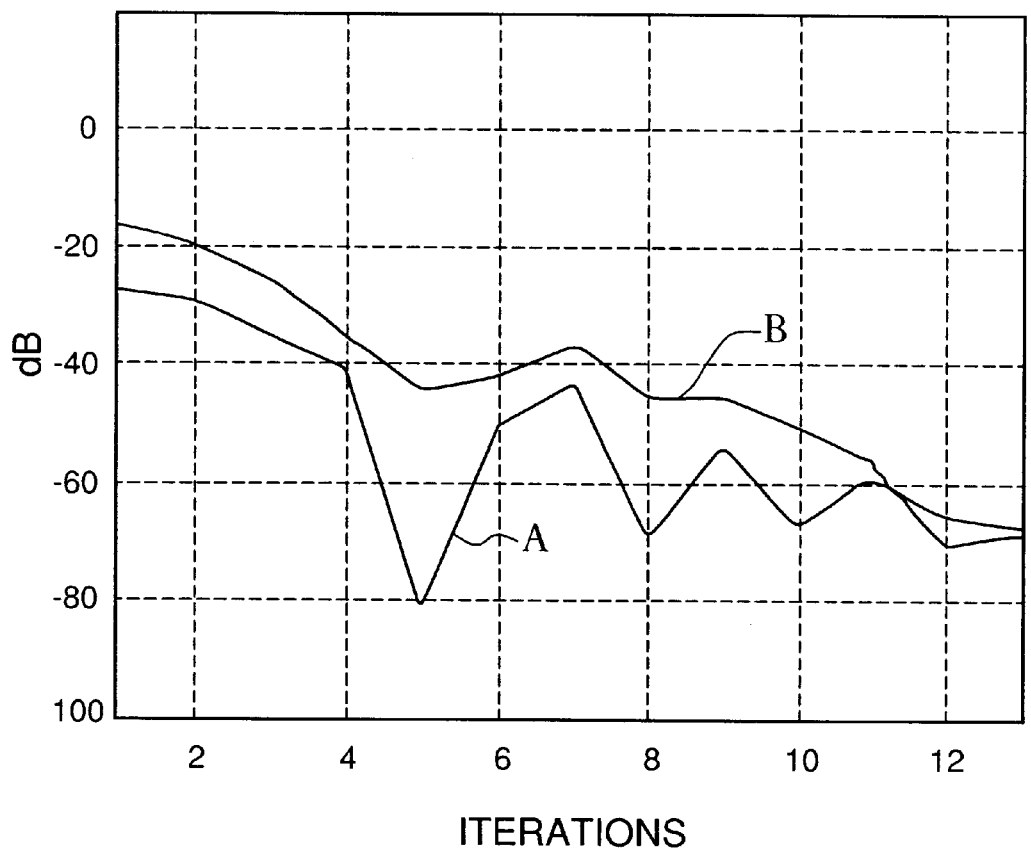
FIG. 10 is a graph of the input and output signal harmonic content for one harmonic in the harmonic cancellation system of the invention.

The effectiveness of the harmonic correction program is demonstrated in FIGS. 8–10. FIG. 8a shows both time-domain and polar plots of an input waveform to the RF amplifier and FIG. 8b shows the output waveform from the amplifier with no harmonic cancellation process running. The input wave is a pure sine wave at 6.5 MHz; no harmonic content appears on the polar plot. At the amplifier output, however, the waveform is severely distorted. The polar plot of the harmonic content in FIG. 8b shows significant second through sixth harmonic energy, with the largest magnitudes in the odd (third and fifth) harmonics.

FIGS. 9a and 9b illustrates the same system input and output with the harmonic cancellation processor, controlled by the program described herein, in operation. The input waveform in FIG. 9a is considerably predistorted. The polar plot shows large energy components in the second through sixth harmonics, with the third and fifth being the largest. At the amplifier output, however, the signal is very close to a nominal sine wave. The polar plot in FIG. 9b confirms that the harmonic content of the output waveform is dramatically reduced to below −40 dBc for all harmonics.

Reference to FIG. 10 shows the convergence and cancellation of the 5th harmonic of the signal depicted in FIGS. 8 and 9, controlled by the harmonic cancellation program as it occurred in a test. The two curves represent the input harmonics and the harmonic content of the RF amplifier output signal. Curve A shows a jagged adjustment of the harmonic content of the predistorted RF input signal over twelve iterations of the convergence program. From iterations 5 through 12, the correction harmonics vary less and less widely as the program is more successful at controlling the harmonic content of the RF output signal, which is shown by Curve B. The harmonic content of the RF output signal of Curve B steadily decreases from about −17 dBc to more than −60 dBc over just twelve iterations of the harmonic cancellation program.

The present invention may be embodied in other specific forms without departing from the spirit or essential attributes thereof and, accordingly, reference should be made to the appended claims, rather than to the foregoing specification, as indicating the scope of the invention.

The following code sequences are exemplary excerpts from the MATLAB program that controls the harmonic cancellation system invention in operation. These excerpts do not represent all of the code necessary to link segments or perform equipment-specific tasks, such as setting all clock rates, controlling peripheral devices and the like. Such routine control programming is deemed to be well within the capabilities of those skilled in the art. The necessary elements of converting an RF signal into time and frequency-domain information, processing the data to determine the characteristics of the waveform, determining the correction factor to suppress harmonics by predistortion, and generating a new predistorted RF waveform, are in the code sequences below. Comments and other non-functional elements are indicated by "%" symbols.

Listed first is the MAIN program:

MAIN PROGRAM

```
%..... clears all MATLAB variables
clear all
%.....initialize several global variables
global cycle pts h h1 h2 h1_old h2_old clk f clk-gs
        h1delta h2delta desired wr-index rd-index clk-index
        correct h2_dB xfer desired_power clip
%..... initial variable settings
min_dB = 45
iter = 0
cycle = 1
pts = 64
max-iter = 100
correct = 0
clip = []
%..... harmonic cancellation program begins
f = [input from operator]   %....frequency selected by operator
comp_var   %.....calls subroutine to compute program variables
%.... initial generation of signal waveform; cosine wave of 0.5 amplitude and period
equal to ppc
wave = []
for i = 1:ppc
    wave = [wave; 0.5 * cos (2 * pi * (i-1)/(ppc))]
end
%.....establish input amplifier response
h1 = fft (wave, ppc).* (2/ppc)
%.....establish desired amplifier response
desired = zeros(size)(h1))
desired(2) = 1 * (ppc/2) * (2/ppc)
desired(ppc) = desired(2)
%.....calibrate amplifier for desired output power
cal_amp              % .....call calibrate amplifier subroutine
%....calculate initial values of h2_dBm and h2_dBc using h2, obtained from cal_amp
subroutine; h2 is one cycle of data from the A/D converter reading signal feedback
h2_dBm = (20 * log10 ((abs(h2(2:h+1))). * sqrt (2)))+30
h2_dBc = h2_dBm(1:h) - ones(size(h2_dBm)).* (h2_dBm(1))
%.....harmonic cancellation loop
while (max(h2_dBc(2:h) > -min_dB) & (iter < max_iter))
    iter = iter + 1
    wr_data   % call write_data subroutine to generate RF waveform
    %.....calculate new values of harmonic attenuation
    h2_dBm = (20 * log10 ((abs(h2(2:h+1))). * sqrt (2)))+30
    h2_dBc = h2_dBm(1:h) - ones(size(h2_dBm)).* (h2_dBm(1))
    %.....check for first pass through cancellation loop
    if iter = 1
        hc_1st      %....if first pass, then use hc_first subroutine
    else
        hc_corr     %.....if second or more pass use hc_corr subroutine
    end
end
END MAIN PROGRAM
```

Listed below is the subroutine CALIBRATE AMPLIFIER

CALIBRATE AMPLIFIER (cal_amp)

```
%... variable definitions...
%desired_power = 50;
desired_power = 50.4139; %110 Watts
attenuation = 40;        % 30 dB attenuator in line with a 10 dB attenuator
actual_power = 0;
power_correct = .4; % fraction of nominal for status
power_iter = 0;      % iteration accumulation variable
%-------------------------------------------------------------%
% The following "upsamples" h1 to become 64 points versus      %
% ppc number ofpoints. The loop then creates h1b which         %
% adds the correct nurnber of cycles to be contained within    %
% the final 64 points to be sent to the D/A signal generator   %
%-------------------------------------------------------------%
h1_up = upsample(h1, pts);
for i=0:pts-2
    for j=1:cycle
```

-continued

CALIBRATE AMPLIFIER (cal_amp)

```
            if(j==1)
                hlb(cycle*i+j) = h1_up(i+j);
            else
                hlb(cycle*i+j) = 0;
            end
        end
    end
end
hlb(pts*cycle) = h1_up(pts);
in_unscaled = (real(ifft(h1b,pts))).*((2*pts/ppc)*(ppc/2));
while((abs(desired_3power-actual_power))>.1)
    power_iter = power_iter+1;
    in = round(((in_unscaled*2047.5)+2047.5).*power_correct);
    %------------------------------------------%
    % "in" represents the scaled input to 8770 %
    %------------------------------------------%
    % if((power_correct > 1)|(power_correct < 0))
        if((power_correct > .9)|(power_correct < 0))
            disp('CAUTION: Not able to produce desired output power content in fundamental'
            disp(['     Adjust the laboratory amplifier gain and press <ENTER>. (Correction
Factor ',num2str(power_correct*100),'%)']);
            pause
            power_correct = 0.4;
        end
    %--------------------------------------------------------%
    % ...generate command for the D/A signal generator       %
    %--------------------------------------------------------%
    string1 = 'WMEM 0';
    for i=1:pts
        string1 = [string1,',',int2str(in(i))];
    end
    string1 = [string 1,';PACLIT 0,',int2str(pts),',10,AUTO;GO;'];
    %--------------------------------------------------------%
    % ...write waveform data to D/A signal generator         %
    %--------------------------------------------------------%
    dev3 = write(wr_index,string1);
    %--------------------------------------------------------%
    % Collect feedback signal data from A/D converter        %
    % 64 = number of points to be collected                  %
    % 1 = single channel                                     %
    % 42 = external clock                                    %
    % 1 =+/- 5 volt scale                                    %
    %                                                        %
    % The second line scales data. 1.22e-3 represents the    %
    % dc offset to be eliminated, and multiplying by 5       %
    % gives the correct scale to the voltages                %
    %--------------------------------------------------------%
    [theData]=gs_read(64,1,42,1);
    theData=((theData-1.22e-3).*5);
    one_cycle = theData(1:ppc);
    step1= fft(one_cycle).*(2/ppc);
    step1_up=upsample(step1,512);
    step1_up_t=(real(ifft(step1_up))).*(512/2);
    step2 = zeros(size(step1_up));
    step2(1) = step1_up(1);
    step2(2) = step1_up(2);
    step2(length(step1_up)) = step1_up(length(step1_up));
    step3 = (real(ifft(step2))).*(512/2);
    [m,n] = max(step3);
    step4 = [step1_up_t(n:512);step1_up_t(1:n-1)];
    h2 = fft(step4, 512).*(2/512);
    h2=h2(1:ppc);
    power_h2_Vrms = (real(h2(2))/sqrt(2));
    actual_power = (10*log10((power_h2_Vrms^2)*1e3/50)) + attenuation;
    power_err = desired_power/actual_power;
    power_correct = power_correct - (1-power_err);
    status
end
if(power_correct < 0.6)
    disp(['WARNING: Using only ',num2str(power_correct*100),'% of the D/A Arbitrary
Waveform Synthesizer dynamic range.']);
    pause
    cal_amp
end
correct = power_correct;
return
```

Listed below is the subroutine COMPUTE VARIABLES:

| COMPUTE VARIABLES SUBROUTINE (com_var) |
|---|
| %...calculate the number of harmonics that can be cancelled<br>    given the limitations of the equipment<br>h=floor (19/f); max sample rate=60MHz, therefore,<br>                          changed the low pass filter, lower cutoff<br>                          frequency<br>%...determination of clock rate and integral number of cycles<br>    for waveform sent to D/A signal generator<br>        %...clk is the frequency to control data output to D/A signal generator<br>        clk = f*pts/cycle;<br>        while ( (clk < 80)  \|  (clk > 130) )<br>            if clk < 80<br>                pts - pts+80;<br>            end<br>            if clk > 130<br>                cycle = cycle+1;<br>            end<br>                clk = f*pts/cycle;<br>end<br>clk_com = ['F', num2str(clk), 'MZAPODM'];<br>ppc_initial=clk gs_initial/f;<br>ppc=(floor(ppc_initial/2) )*2;     forces ppc to be an even integer<br>                                         for use in zero pad routine<br>clk_gs=ppc*f;<br>%...initialize h2_dD...<br>h2_dB = ones (size (1:ppc))<br>return |

Listed below is the subroutine WRITE DATA:

| WRITE DATA (wr_data) |
|---|
| %.....formats the data, outputs to D/A converter, reads data from A/D converter and formats it<br>        input : h1 array<br>        output: h2 array<br>        h1_up = upsample (h1, pts)<br>        for i = 0:pts-2<br>        for j = 1:cycle<br>            ifj=1)<br>                h1b (cycle * i+j) = h1_up (i+j)<br>            else<br>                h1b (cycle* i+j) = 0<br>            end<br>        end<br>h1b (pts * cycle) = h1_up(pts)<br>in_unscaled = (real (ifft(h1b, pts))). * ((2 * pts/ppc) * (ppc/2))<br>in = round (((in_unscaled * 2047.5) + 2047.5). * correct)<br>%.....create array of values for output to D/A converter<br>for i = 1:pts<br>string1 = [string1,int2str(in(i))]<br>end<br>%.....write waveform data out to D/A converter (dev) [designator "dev" represents the<br>destination address for the D/A converter waveform generator]<br>dev(x) = write (wr_index, string1)<br>%.....collect data from the A/D converter<br>[thedata] = read (64,1,42,1)<br>one_cycle = thedata (1:ppc)<br>step1 = fft(one_cycle). * (2/ppc)<br>step1_up = upsample (step1, 512)<br>step1_up_t = (real(ifft (step1_up))). * (512/2)<br>step2 = zeros (size(step1_up))<br>step2 (1) = step1_up(1)<br>step2 (2) = step1_up(2)<br>step2 (length (step1_up)) = step1_up (length (step1_up))<br>step3 = real (ifft ((step2))). * (512/2)<br>[m,n] = max(step3)<br>step4 = [step1_up_t (n:512); step1_up_t(1:n-1)]<br>h2 = fft (step4,512). * (2/512)<br>h2 = h2 (1:ppc) |

Listed below is the subroutine HARMONIC CORRECTION FIRST:

| HARMONIC CORRECTION FIRST (hc_first) |
|---|
| %                                                              %<br>%    routine to make the first correction attempt on the    %<br>%    signal to achieve the desired ampifier response       %<br>%    input : h2                                             %<br>%    output: h1 (modified)                           %<br>%-----------------------------------------------------------  %<br>%...Routine...<br>h1_old = h1;<br>h2_old = h2;<br>rho = abs(h2).*(abs(h1(2))/abs(h2(2)));<br>theta = zeros(size(h2));<br>theta(1) = 0;<br>theta(2) = angle(h2(2));<br>theta (ppc) = angle(h2(ppc));<br>theta(3:ppc-1) = angle(h2(3:ppc-1)) + pi;<br>h1 = rho.*exp(sqrt(-1)*theta); |

Listed below is the subroutine HARMONIC CORRECTION:

---
HARMONIC CORRECTION (hc_corr)
---
```
h2delta = h2 (2:h+1) - h2_old (2:h+1);
h2delta = h2delta% = ui;
h1delta = h1 (2:h=1) - h1_old(2:h=1);
h1delta = h1delta% =ui;
transmax = 6;
xfer = (h2delta./h1delta);
for NN=1:h
    tr (NN) = abs (xfer (NN));
    if tr (NN) > 10 ^ (transmax/20)
        xfer (NN) = (xfer (NN) * (10 ^ (transmax/20) ) )/tr (NM);
    end
end
h1_old = h1;
h2_old = h2
for NL = 1:h
    h1 (NL+1) = h1_old (NL+1) + (weight (NL) * (desired NL+1) - h2 (NL+1) )./xfer (NL));
end
```
---

Listed below is the subroutine UPSAMPLE:

---
UPSAMPLE
---
```
%.....shift the fft data to the center
shifted_data=fftshift (data);
%....call zero pad routine to zero pad ends to desired length
shifted_data=zero_pad (shifted_data, out_size);
%.....shift the fft data to the ends
X=fftshift (shifted_data);
return
```
---

Copyright 1999 Marconi Aerospace Electronic System, Inc.

What is claimed is:

1. A computer-controlled apparatus for canceling output signal harmonics in a radio frequency transmission system having an RF power amplifier, comprising:
   a means for diverting a portion of the amplifier output as a feedback signal; and,
   a harmonic cancellation processor, said processor comprising a means for digitally sampling the feedback signal from the diverting means, a digital signal processor operated by computer program instructions for performing harmonic analysis of the feedback signal and for generating in digital form a predistorted RF waveform, and,
   a means for converting the predistorted digital RF waveform into a predistorted analog RF waveform that is input to the RF power amplifier.

2. The apparatus for canceling output signal harmonics in a radio frequency transmission system of claim 1, further comprising;
   a medium for storing computer program instructions for operating the digital signal processor.

3. The apparatus for canceling output signal harmonics in a radio frequency transmission system of claim 2, wherein;
   the computer program instructions for the digital signal processor comprise:
      means for analyzing the harmonic content of the sampled RF feedback signal,
      means for comparing the harmonic content of the RF feedback signal to a history value for harmonic content,
      means for adaptively correcting a predistorted RF waveform based on the harmonic content of the RF feedback signal to cancel harmonics produced by the RF amplifier when the predistorted waveform is input to the amplifier, and
      means for producing a digital sample representation of the predistorted RF waveform for conversion to analog form and input to the RF amplifier.

4. A radio frequency transmission system comprising:
   a radio frequency amplifier,
   a means for diverting a portion of the amplifier output for analysis,
   a harmonic cancellation processor for performing the analysis of the diverted amplifier signal output, said harmonic cancellation processor comprising;
   a means for digitally sampling the diverted amplifier output,
   a digital signal processor for performing real-time harmonic analysis of the sampled amplifier output,
   a means for generating a predistorted radio frequency signal for input to the radio frequency amplifier, and
   a means for adapting the predistorted RF signal based upon the harmonic analysis of the sampled amplifier output for canceling amplifier harmonics when the predistorted RF signal is input to the amplifier.

5. The radio frequency transmission system of claim 4, further comprising a means for modulating the radio frequency signal with a baseband information signal.

6. The radio frequency transmission system of claim 4, further comprising a means for selecting an operating frequency.

7. The radio frequency transmission system of claim 4, further comprising a means for electromagnetic transmission of RF signal power.

8. The radio frequency transmission system of claim 4, further comprising a means for modulating the analog radio frequency signal generating means to produce a frequency modulated radio frequency signal.

9. A method for canceling RF harmonics in an RF transmission system using a programmable digital computer to analyze the RF harmonic content of a sampled RF waveform from an RF amplifier and produce an adapted predistorted RF waveform for input into the amplifier to cancel said RF harmonics, said method comprising the steps:

creating a matrix of digital samples of a predetermined portion of an RF waveform produced by an amplifier, performing a time to frequency-domain transform on the samples of RF waveform to quantify the harmonic content of the waveform, comparing each measured harmonic magnitude and phase to an immediately previous magnitude and phase that is stored in memory for the same harmonic, comparing each harmonic magnitude and phase in the current predistorted waveform to an immediately previous magnitude and phase that is stored in memory for the same harmonic, calculating a transfer function for the amplifier using the results of the comparisons of the previous two steps, computing a new RF input waveform for the amplifier that is predistorted using the calculated transfer function for the amplifier, generating a new RF input waveform with predistortion for input to the RF amplifier to cancel harmonics produced by the amplifier.

10. The method of claim 9, wherein the step of performing a time to frequency-domain transform of the sample RF waveform comprises the steps:

calculating a Fourier transform of the sampled time-domain signal data to obtain frequency-domain values, and storing the transform values in a memory matrix of frequency-domain data.

11. The method of claim 9, wherein the step of comparing each measured harmonic magnitude and phase to a previous magnitude and phase comprises the steps:

calculating a point-by-point difference between a matrix of measured frequency-domain data comprising values of magnitude and phase and a second matrix of frequency-domain data in a history matrix created from an immediately previous measurement of the harmonic content of the amplifier RF output signal, said difference being calculated using corresponding data points in the measured data and history matrices; and storing the calculated difference values in a data matrix as each difference value is determined.

12. The method of claim 11, wherein the step of comparing the harmonic magnitude and phase in the current predistorted waveform to an immediately previous magnitude and phase for the same harmonic stored in memory comprises the steps:

calculating the point-by-point difference between a matrix of values representing the frequency-domain content of the current predistorted RF waveform and a history matrix of frequency-domain values for an RF waveform, said waveform being the immediately previous RF waveform that was input to the RF amplifier after a previous adaptive correction, said difference being calculated using corresponding data points in the current data and history matrices; and storing the calculated difference values in a data matrix as each difference value is determined.

13. The method of claim 12, wherein the step of calculating a transfer function comprises the steps:

computing a matrix of transfer function values as quotients of two values, a dividend and a divisor, said dividend being one of the stored values from the matrix of differences calculated for the current and previous sampled RF waveforms, said divisor being one of the stored values from the matrix of differences calculated for the current and previous predistorted RF input waveforms, performing each computation on discrete frequency-domain values making no provision for any potential cross-coupling effects between harmonics in the signal to enhance the speed of the operation, and storing the matrix of transfer function values in memory as each value is computed to serve as operands in a later step in which the predistorted RF waveform is adjusted to reduce the harmonic output of the RF amplifier.

14. The method of claim 13, wherein the step of computing a new RF input waveform comprises the steps:

building a new matrix of frequency-domain values to represent a predistorted RF signal adjusted to reduce harmonic content when passed through the RF amplifier, said adjustment being accomplished by correcting the matrix of the current predistorted RF signal frequency-domain values each by a sum, said sum deriving from the quotient of a desired signal harmonic output minus a value from the measured harmonic content difference matrix previously derived, divided by a value from the transfer function matrix previously derived, and storing said new matrix of frequency-domain RF signal values.

15. The method of claim 14, wherein the step of generating a new RF input waveform with predistortion comprises the steps:

performing a frequency to time-domain transform of the new matrix of frequency-domain RF signal values to produce a digital time-domain data representation of the predistorted RF signal;

storing the time-domain predistorted RF signal data in memory; and writing the predistorted time-domain RF signal data to a digital to analog coverter to generate a predistorted RF input waveform for the RF amplifier.

16. A computer program process for canceling harmonic signal components in a radio transmission system comprising an RF power amplifier, said process comprising the steps:

creating a predistorted RF analog waveform from a digital data array representing at least one cycle of said waveform;

routing said analog RF waveform into the RF power amplifier and digitally sampling a portion of the amplifier output;

converting the sampled data into an N by N frequency-domain data matrix, where N is the number of harmonics to be cancelled;

computing a complex transfer function for each in-band signal harmonic, limiting the computation to the discrete complex values for each harmonic and ignoring all potential harmonic interactions by operating only on the main diagonal of the matrix, row(x) and column(x) where x is the harmonic, operating on a complex data matrix representing the predistorted RF signal most recently produced and routed to the RF amplifier, using the complex transfer function for each harmonic, to produce a new complex data matrix predistorted to reduce harmonic output in the RF amplifier;

converting the predistorted RF data to time domain digital values and further converting said digital values to an analog signal routed to the RF amplifier.

17. The computer program process of claim 16, where in the step of creating a predistorted RF analog waveform comprises the steps:

creating a frequency-domain matrix of amplitude and phase values representing an RF waveform;

converting the frequency-domain waveform values to a time-domain data structure, writing the time-domain data to a digital to analog converter to produce an analog RF signal that is input to an RF power amplifier.

18. The computer program process of claim 16, where in the step of converting the sampled data into an N by N matrix comprises the steps:

creating an array of digital samples of a predetermined portion of the RF signal from the amplifier, performing a time-domain to frequency-domain transform on the samples of RF signal to quantify a measured harmonic content of the waveform in a new matrix of measured frequency-domain values.

19. The computer program process of claim 16, where in the step of computing a complex transfer function for each signal harmonic comprises the steps:

comparing the measured frequency-domain harmonic matrix data to a history matrix of frequency-domain values for harmonic signal content stored in said history matrix during a previous measurement, said measurement being the most recent, and storing the difference in a delta matrix for signal harmonics, comparing the frequency-domain matrix of amplitude and phase values used to create the RF signal to a matrix of history values for the amplitude and phase of the most recent frequency-domain RF waveform matrix stored in memory, and storing the difference in a delta matrix for RF signal values, computing a transfer function data matrix for each signal harmonic as the quotient of the delta matrix for signal harmonics over the delta matrix for RF signal values, ignoring potential cross-coupling effects between harmonics by performing the calculations discretely on individual harmonic values.

20. The computer program process of claim 16, where in the step of operating on a complex data matrix comprises the steps:

building a new matrix of frequency-domain values to represent an RF signal adjusted to reduce harmonic content, said adjustment being accomplished by correcting the matrix of RF signal frequency-domain values by a sum, said sum deriving from the point by point quotient of a desired signal harmonic output minus the measured harmonic content, divided by a transfer function value from the transfer function matrix previously derived for each harmonic, and storing said new matrix of RF frequency-domain signal values.

21. A computer program process for canceling harmonic signal components in a radio transmission system comprising an RF power amplifier, said process comprising the steps:

creating a frequency-domain matrix of amplitude and phase values representing an RF waveform;

converting the frequency-domain waveform values to a time-domain data structure, writing the time-domain data to a digital to analog converter to produce an analog RF signal that is input to an RF power amplifier, producing an RF analog signal at the amplifier output, digitally sampling the RF signal produced by the high-power RF amplifier, creating an array of digital samples of a predetermined portion of the RF signal from the amplifier, performing a time-domain to frequency-domain transform on the samples of RF signal to quantify a measured harmonic content of the waveform in a new matrix of measured frequency-domain values, comparing the measured frequency-domain harmonic matrix data to a history matrix of frequency-domain values for harmonic signal content stored in said history matrix during a previous measurement, said measurement being the most recent, and storing the difference in a delta matrix for signal harmonics, comparing the frequency-domain matrix of amplitude and phase values used to create the RF signal to a matrix of history values for the amplitude and phase of the most recent frequency-domain RF waveform matrix stored in memory, and storing the difference in a delta matrix for RF signal values, computing a transfer function data matrix for each signal harmonic as the quotient of the delta matrix for signal harmonics over the delta matrix for RF signal values, ignoring potential cross-coupling effects between harmonics by performing the calculations discretely on individual harmonic values, building a new matrix of frequency-domain values to represent an RF signal adjusted to reduce harmonic content, said adjustment being accomplished by correcting the matrix of RF signal frequency-domain values by a sum, said sum deriving from the point by point quotient of a desired signal harmonic output minus the measured harmonic content, divided by a transfer function value from the transfer function matrix previously derived for each harmonic, storing said new matrix of RF signal values in the frequency-domain before converting them to time-domain values, then further converting the time-domain values to the analog signal that is input to the RF amplifier.

22. A computer-readable storage medium containing a set of instructions for causing a digital signal processing computer in a radio frequency transmission system to perform the following steps:

creating a matrix of digital samples of a predetermined portion of an RF waveform produced by an amplifier, performing a time to frequency-domain transform on the samples of RF waveform to quantify the harmonic content of the waveform, comparing each measured harmonic magnitude and phase to an immediately previous magnitude and phase that is stored in memory for the same harmonic, comparing each harmonic magnitude and phase in the current predistorted waveform to an immediately previous magnitude and phase that is stored in memory for the same harmonic, calculating a transfer function for the amplifier using the results of the comparisons of the previous two steps, computing a new RF input waveform for the amplifier that is predistorted using the calculated transfer function for the amplifier, generating a new RF input waveform with predistortion for input to the RF amplifier to cancel harmonics produced by the amplifier.

23. The computer readable storage medium containing instructions including the steps of claim 22, wherein the step of performing a time to frequency-domain transform of the sample RF waveform comprises the steps:

calculating a Fourier transform of the sampled time-domain signal data to obtain frequency-domain values, and storing the transform values in a memory matrix of frequency-domain data.

24. The computer readable storage medium containing instructions including the steps of claim 23, wherein the step of comparing each measured harmonic magnitude and phase to a previous magnitude and phase comprises the steps:

calculating a point-by-point difference between a matrix of measured frequency-domain data comprising values of magnitude and phase and a second matrix of frequency-domain data in a history matrix created from an immediately previous measurement of the harmonic content of the amplifier RF output signal, said difference being calculated using corresponding data points in the measured data and history matrices; and storing the calculated difference values in a data matrix as each difference value is determined.

25. The computer readable storage medium containing instructions including the steps of claim 24, wherein the step of comparing the harmonic magnitude and phase in the current predistorted waveform to an immediately previous magnitude and phase for the same harmonic stored in memory comprises the steps:

calculating the point-by-point difference between a matrix of values representing the frequency-domain content of the current predistorted RF waveform and a history matrix of frequency-domain values for an RF waveform, said waveform being the immediately previous RF waveform that was input to the RF amplifier after a previous adaptive correction, said difference being calculated using corresponding data points in the current data and history matrices; and storing the calculated difference values in a data matrix as each difference value is determined.

26. The computer readable storage medium containing instructions including the steps of claim 25, wherein the step of calculating a transfer function comprises the steps:

computing a matrix of transfer function values as quotients of two values, a dividend and a divisor, said dividend being one of the stored values from the matrix of differences calculated for the current and previous sampled RF waveforms, said divisor being one of the stored values from the matrix of differences calculated for the current and previous predistorted RF input waveforms, performing each computation on discrete frequency-domain values making no provision for any potential cross-coupling effects between harmonics in the signal to enhance the speed of the operation, and storing the matrix of transfer function values in memory as each value is computed to serve as operands in a later step in which the predistorted RF waveform is adjusted to reduce the harmonic output of the RF amplifier.

27. The computer readable storage medium containing instructions including the steps of claim 26, wherein the step of computing a new RF input waveform comprises the steps:

building a new matrix of frequency-domain values to represent a predistorted RF signal adjusted to reduce harmonic content when passed through the RF amplifier, said adjustment being accomplished by correcting the matrix of the current predistorted RF signal frequency-domain values each by a sum, said sum deriving from the quotient of a desired signal harmonic output minus a value from the measured harmonic content difference matrix previously derived, divided by a value from the transfer function matrix previously derived, and storing said new matrix of frequency-domain RF signal values.

28. The computer readable storage medium containing instructions including the steps of claim 27, wherein the step of generating a new RF input waveform with predistortion comprises the steps:

performing a frequency to time-domain transform of the new matrix of frequency-domain RF signal values to produce a digital time-domain data representation of the predistorted RF signal;

storing the time-domain predistorted RF signal data in memory; and writing the predistorted time-domain RF signal data to a digital to analog coverter to generate a predistorted RF input waveform for the RF amplifier.

* * * * *